United States Patent
Rice et al.

(10) Patent No.: US 12,074,010 B2
(45) Date of Patent: Aug. 27, 2024

(54) ATOMIC LAYER DEPOSITION PART COATING CHAMBER

(71) Applicant: Applied Materials, Inc., Santa Clara, CA (US)

(72) Inventors: Michael R. Rice, Pleasanton, CA (US); Hanish Kumar Panavalappil Kumarankutty, Bangalore (IN); Steven D. Marcus, San Jose, CA (US); Kirubanandan Naina Shanmugam, Bangalore (IN); Sriharsha Dharmapura Sathyanarayanamurthy, Bengaluru (IN); Madhukar Krishna, Bengaluru (IN); Shivaprakash Padadayya Hiremath, Bangalore (IN); Senthil Kumar Nattamai Subramanian, Hosur (IN); Sankar Menon Cherubala Pathayapura, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/470,294

(22) Filed: Sep. 9, 2021

(65) Prior Publication Data
US 2023/0074149 A1 Mar. 9, 2023

(51) Int. Cl.
*H01J 37/32* (2006.01)
*C23C 16/455* (2006.01)
(Continued)

(52) U.S. Cl.
CPC .... *H01J 37/3244* (2013.01); *C23C 16/45536* (2013.01); *C23C 16/45544* (2013.01);
(Continued)

(58) Field of Classification Search
CPC ........ C23C 16/45512; C23C 16/45519; C23C 16/45536; C23C 16/45544;
(Continued)

(56) References Cited

U.S. PATENT DOCUMENTS 3,854,443 A * 12/1974 Baerg .................... C23C 16/455
118/724
5,062,386 A * 11/1991 Christensen ...... C23C 16/45574
118/724
(Continued)

OTHER PUBLICATIONS

International Search Report for PCT/US2022/042640, dated Dec. 14, 2022.

*Primary Examiner* — Benjamin Kendall
(74) *Attorney, Agent, or Firm* — MOSER TABOA

(57) ABSTRACT

Methods and apparatus for coating processing reactor component parts are provided herein. In some embodiments, a part coating reactor includes: a lower body and a lid assembly that together define and enclose an interior volume; one or more heaters disposed in the lid assembly; one or more coolant channels disposed in the lid assembly to flow a heat transfer medium therethrough; a plurality of gas passages disposed through the lid assembly to facilitate providing one or more gases to the interior volume, wherein the plurality of gas passages include a plurality of fluidly independent plenums disposed in the lid assembly; and one or more mounting brackets to facilitate coupling a workpiece to the lid assembly.

67 Claims, 9 Drawing Sheets

(51) Int. Cl.
*C23C 16/458* (2006.01)
*C23C 16/46* (2006.01)

(52) U.S. Cl.
CPC .......... *C23C 16/4586* (2013.01); *C23C 16/46* (2013.01); *C23C 16/463* (2013.01); *H01J 37/32357* (2013.01); *H01J 37/32522* (2013.01); *H01J 37/32724* (2013.01); *C23C 16/4582* (2013.01)

(58) Field of Classification Search
CPC ........ C23C 16/45561; C23C 16/45565; C23C 16/45574; C23C 16/45591; C23C 16/4582; C23C 16/4586; C23C 16/46; C23C 16/463; H01J 37/32357; H01J 37/3244; H01J 37/32449; H01J 37/32522; H01J 37/32633; H01J 37/32724
See application file for complete search history.

(56) References Cited

U.S. PATENT DOCUMENTS

| | | | |
|---|---|---|---|
| 8,083,855 B2* | 12/2011 | Dhindsa | G05D 23/22 118/724 |
| 9,466,506 B2* | 10/2016 | Masuda | H01J 37/3244 |
| 2004/0043228 A1* | 3/2004 | Derderian | H01L 29/06 428/457 |
| 2005/0241766 A1* | 11/2005 | Dhindsa | H01L 21/306 156/345.37 |
| 2005/0279731 A1* | 12/2005 | Saito | H01L 21/67069 257/E21.252 |
| 2007/0090516 A1* | 4/2007 | White | H01L 21/67109 257/704 |
| 2007/0108161 A1 | 5/2007 | Murugesh et al. | |
| 2009/0081878 A1* | 3/2009 | Dhindsa | H01J 37/32091 156/345.34 |
| 2009/0095220 A1* | 4/2009 | Meinhold | H01J 37/3244 118/712 |
| 2009/0188625 A1* | 7/2009 | Carducci | H01J 37/32467 156/345.1 |
| 2010/0294199 A1* | 11/2010 | Tran | H01L 21/68785 118/723 R |
| 2014/0291286 A1* | 10/2014 | Okayama | C23C 16/45519 239/548 |
| 2016/0340781 A1* | 11/2016 | Thomas | C23C 16/4408 |
| 2017/0101712 A1* | 4/2017 | Bansal | C23C 16/45565 |
| 2019/0078210 A1 | 3/2019 | Gungor et al. | |
| 2019/0119816 A1 | 4/2019 | Zhang et al. | |
| 2019/0185999 A1 | 6/2019 | Shanbhag et al. | |
| 2019/0304756 A1 | 10/2019 | Kalita et al. | |
| 2019/0368035 A1 | 12/2019 | Malik et al. | |
| 2020/0013589 A1 | 1/2020 | Balaraman et al. | |
| 2020/0024739 A1* | 1/2020 | Roberts | C23C 16/52 |
| 2020/0098549 A1* | 3/2020 | Park | H01J 37/3244 |

* cited by examiner

ATOMIC LAYER DEPOSITION PART COATING CHAMBER

FIELD

Embodiments of the present disclosure generally relate to apparatus and techniques for coating components.

BACKGROUND

Many microelectronic device fabrication processes are performed reactors having coated parts or components. Such coated components can provide one or more benefits such as, for example, reduced contamination of substrates disposed in the reactor during processing, improved process results, improved chamber uptime before requiring maintenance, or the like. The inventors have observed that cost of coating reactor parts, such as gas distribution faceplates, showerheads, or the like, can be very high. For example, conventionally, such parts are coated in a batch reactor that can, for example, hold about 2 to 8 faceplates per batch. However, the coating process can take between about 3-8 days per batch, depending upon the particular part configuration and the desired coating to be applied. Thus, even with the benefit of coating multiple parts at once, the per unit cost for such coated parts remains high.

Therefore, the inventors have provided improved apparatus and techniques for coating processing reactor component parts.

SUMMARY

Methods and apparatus for coating processing reactor component parts are provided herein. In some embodiments, a part coating reactor includes: a lower body and a lid assembly that together define and enclose an interior volume; one or more heaters disposed in the lid assembly; one or more coolant channels disposed in the lid assembly to flow a heat transfer medium therethrough; a plurality of gas passages disposed through the lid assembly to facilitate providing one or more gases to the interior volume, wherein the plurality of gas passages include a plurality of fluidly independent plenums disposed in the lid assembly; and one or more mounting brackets to facilitate coupling a workpiece to the lid assembly.

In some embodiments, a part coating reactor includes: a lower body and a lid assembly that together define and enclose an interior volume; one or more heaters disposed in the lid assembly; one or more coolant channels disposed in the lid assembly to flow a heat transfer medium therethrough; a plurality of gas passages disposed through the lid assembly to facilitate providing one or more gases to the interior volume, wherein the plurality of gas passages include a plurality of fluidly independent plenums disposed in the lid assembly; one or more thermal conduction chokes provided in the lid assembly to facilitate reduction of heat transfer away from the upper central portion of the lid assembly above the interior volume; one or more mounting brackets to facilitate coupling a workpiece to the lid assembly; a central opening formed through the lower body to receive a shaft of a pedestal heater; and a pedestal hub coupled to a bottom plate of the lower body to surround and enclose the shaft of the pedestal heater when installed.

In some embodiments, a method for coating a part via atomic layer deposition includes: fastening a workpiece to be coated to an interior volume facing portion of a part coating reactor; and performing an ALD process on the fastened workpiece within the part coating reactor. In some embodiments, the workpiece is a showerhead. In some embodiments, the workpiece is a substrate support pedestal, such as a pedestal heater, configured to support a planar substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
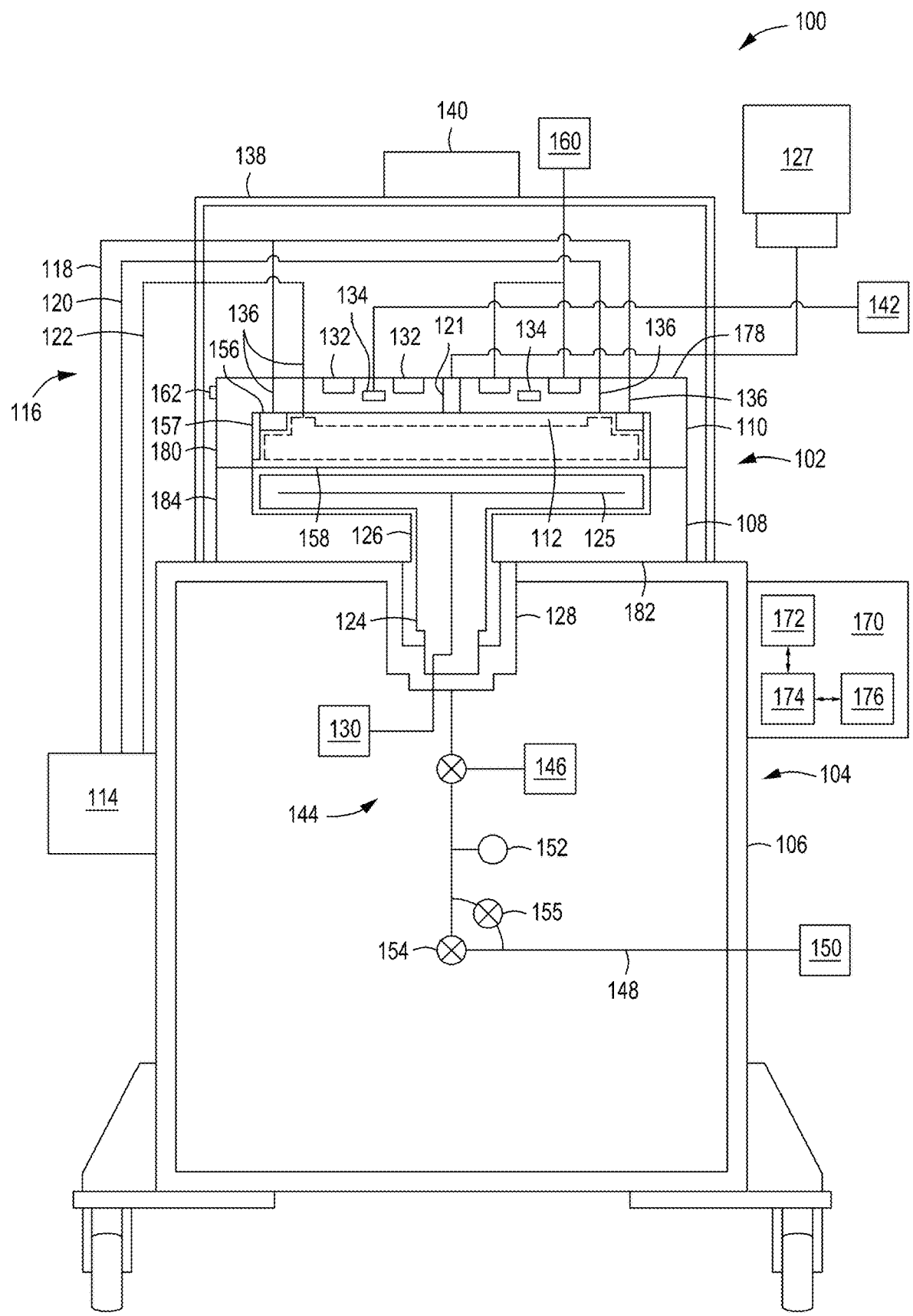
FIG. 1 is a schematic side view of a part coating reactor in accordance with at least some embodiments of the disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a part coating reactor are provided herein. In some embodiments, the part coating reactor is configured for deposition of materials on parts using atomic layer deposition (ALD) processes. The methods and apparatus of the present disclosure advantageously reduce cycle time and cost to produce coated parts by an order of magnitude.

FIG. 1 is a schematic side view of a part coating reactor in accordance with at least some embodiments of the disclosure. As depicted in FIG. 1, a part coating system 100 is shown having a part coating reactor 102 disposed on a support 104. The support 104 illustratively shown as including a frame assembly 106. The frame assembly 106 is depicted having wheels, but alternatively or additionally, the frame assembly 106 can include leveling feet, stabilizing brackets, or other elements to support the part coating reactor 102. In some embodiments, the frame assembly 106 may be omitted and the part coating reactor 102 can be disposed on some other type of support 104, such as by resting or mounting on another component such as, for example, a base, a transfer chamber of a cluster tool, a parts handling system for feeding and retrieving parts to/from the part coating reactor 102, or the like.

A cover 138 may be provided to enclose the part coating reactor 102. The cover 138 may be disposed on the support 104 or otherwise be coupled to the part coating reactor 102. The cover 138 can include a plurality of openings to facilitate airflow therethrough to cool the part coating reactor 102. A fan 140 may be provided to enhance air cooling of the exterior of the part coating reactor 102.

Figure 3:
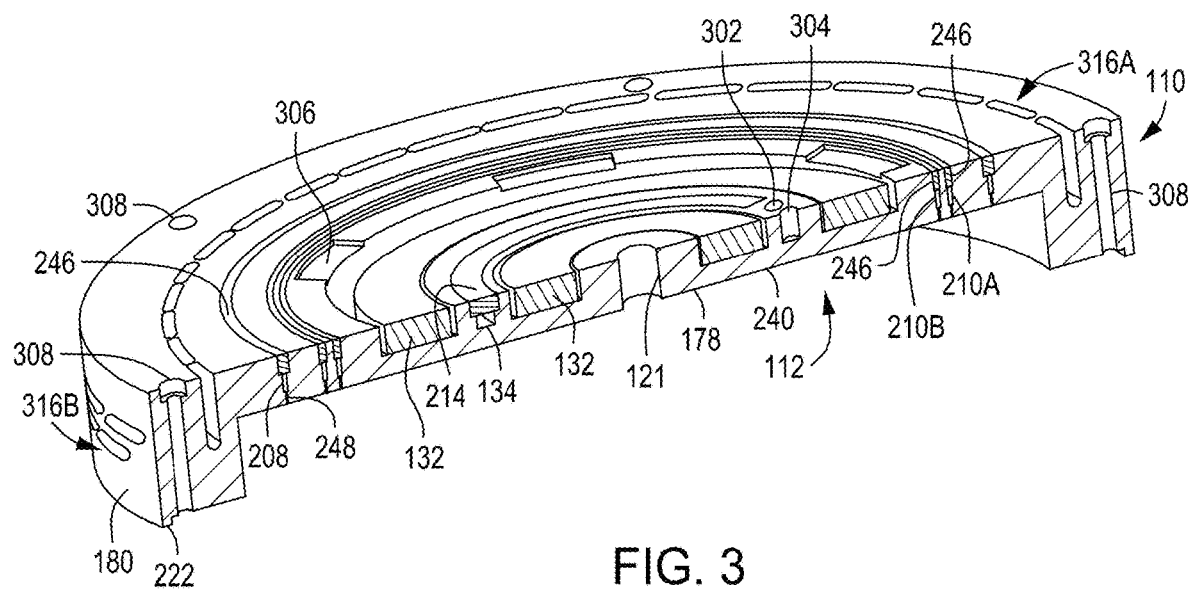
FIG. 3 is a top isometric view in cross-section of a portion of a lid assembly of a part coating reactor in accordance with at least some embodiments of the disclosure.
Figure 7:
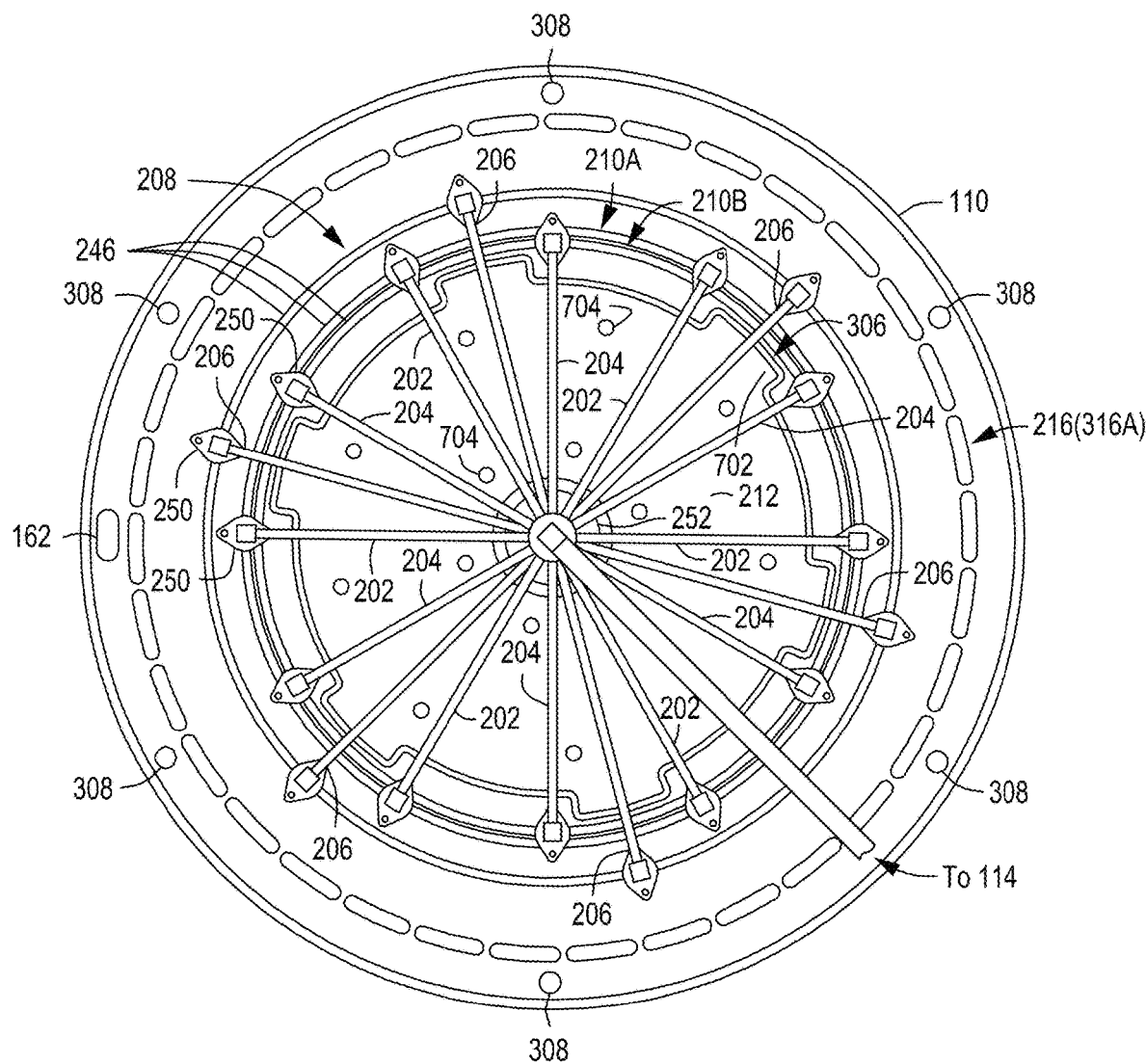
FIG. 7 is a schematic top view of a portion of a part coating reactor in accordance with at least some embodiments of the disclosure.
Figure 12:
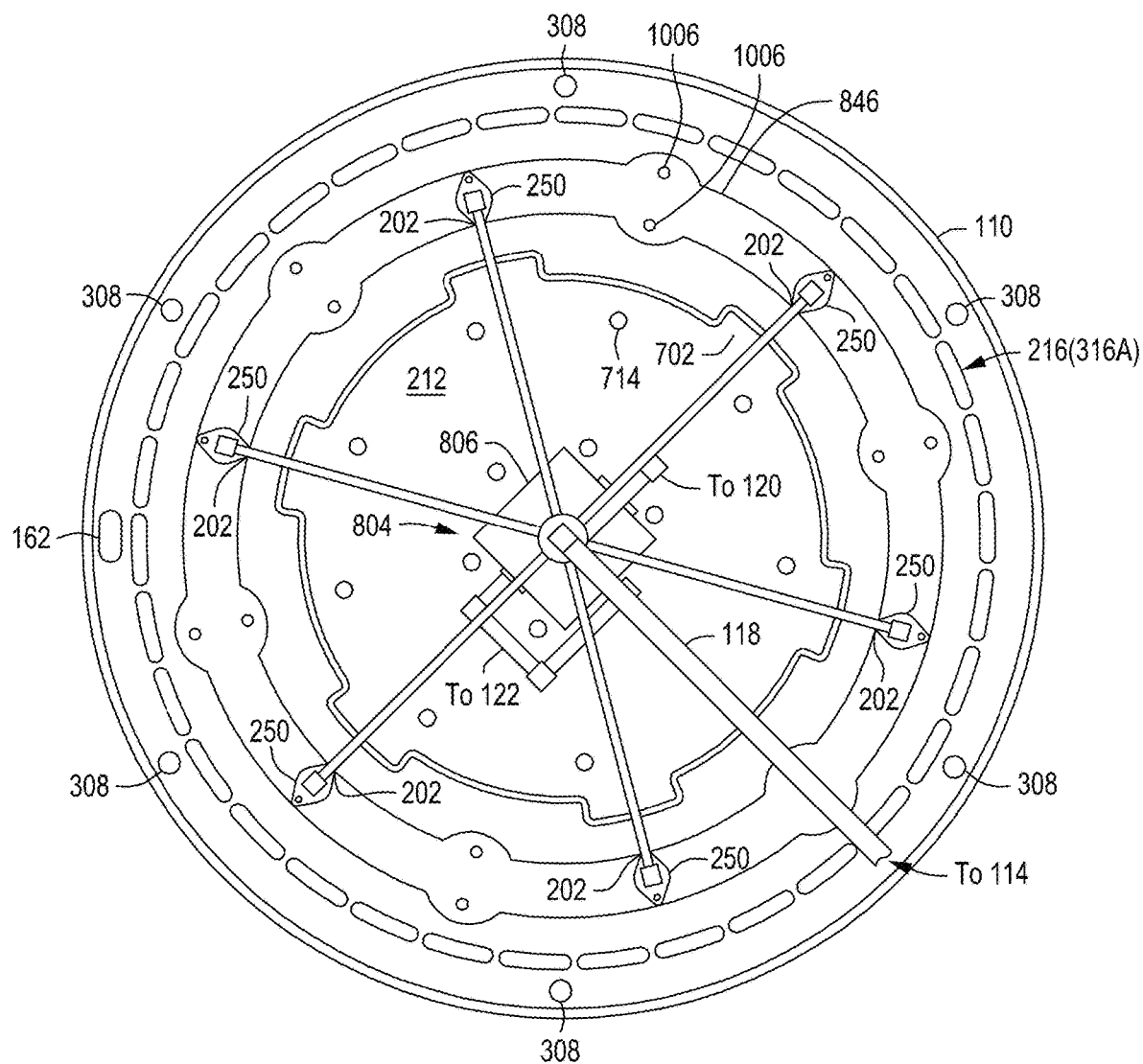
FIG. 12 is a schematic top view of a portion of a part coating reactor in accordance with at least some embodiments of the disclosure.

The part coating reactor 102 generally includes a lower body 108 and a lid assembly 110 that together define and enclose an interior volume 112. The interior volume may be small, such as about 1 to about 1.5 liters. Each of the lower body 108 and the lid assembly 110 may include a cavity formed in facing surfaces of the components that together define the interior volume 112 when the lower body 108 and the lid assembly 110 are assembled together. For example, the lower body 108 may include a bottom plate 182 and a sidewall 184 extending upwardly from the bottom plate 182 and partially enclosing the interior volume 112. Similarly, the lid assembly 110 may include a top plate 178 and a sidewall 180 extending downwardly from the top plate 178 and partially enclosing the interior volume 112. In some embodiments, each of the sidewalls 180, 184 may have the same or substantially the same dimension defining the interior volume 112 (e.g., diameter for circular chamber configurations). In some embodiments a dimension across the interior volume 112 within the sidewalls 180, 184 (e.g., an inner diameter), is about 14 to about 20 inches. In some embodiments, the lid assembly 110 and the lower body 108 may be coupled together, for example, by clamping, bolting, screwing, or the like. For example, as shown in FIGS. 3, 7, and 12, a plurality of holes 308 may be provided to couple the lid assembly to the lower body, e.g., using bolts extending to corresponding threaded holes in the lower body 108. In some embodiments, the holes 308 may be countersunk to receive the heads of corresponding bolts, screws, or the like. The plurality of holes 308 may be arranged to provide a uniform seal between the lid assembly 110 and lower body 108, e.g., to prevent leakage of gases provided to the interior volume 112. A lift system (not shown), may be provided to lift the lid assembly 110 to facilitate insertion and removal of a workpiece to be coated or for other maintenance or actions that require access to the interior volume 112. The lid assembly 110 and the lower body can be made from any suitable process compatible materials, such as aluminum, stainless steel, or the like.

Figure 2:
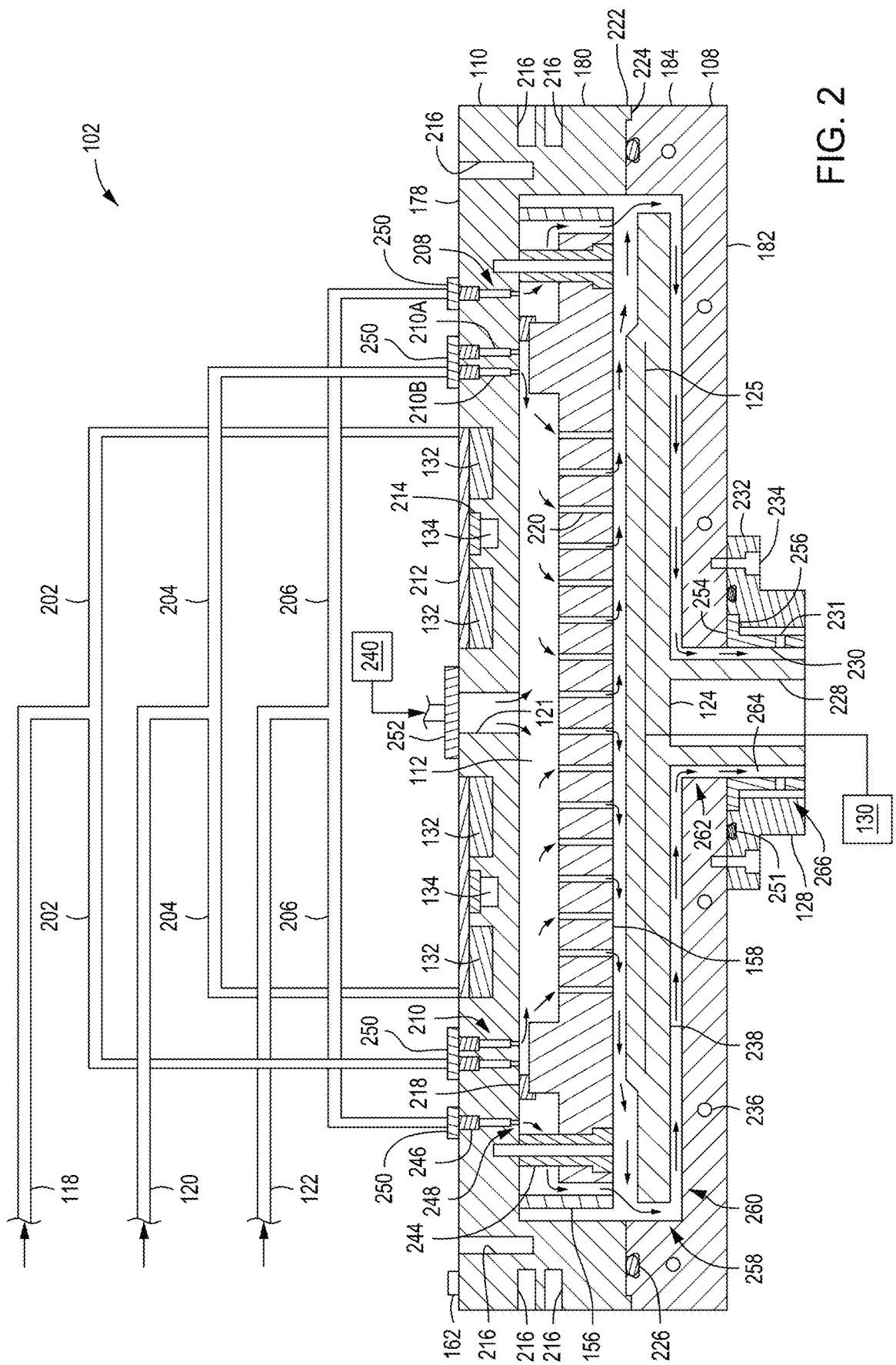
FIG. 2 is a schematic cross-sectional side view of a portion of a part coating reactor in accordance with at least some embodiments of the disclosure.
Figure 8:
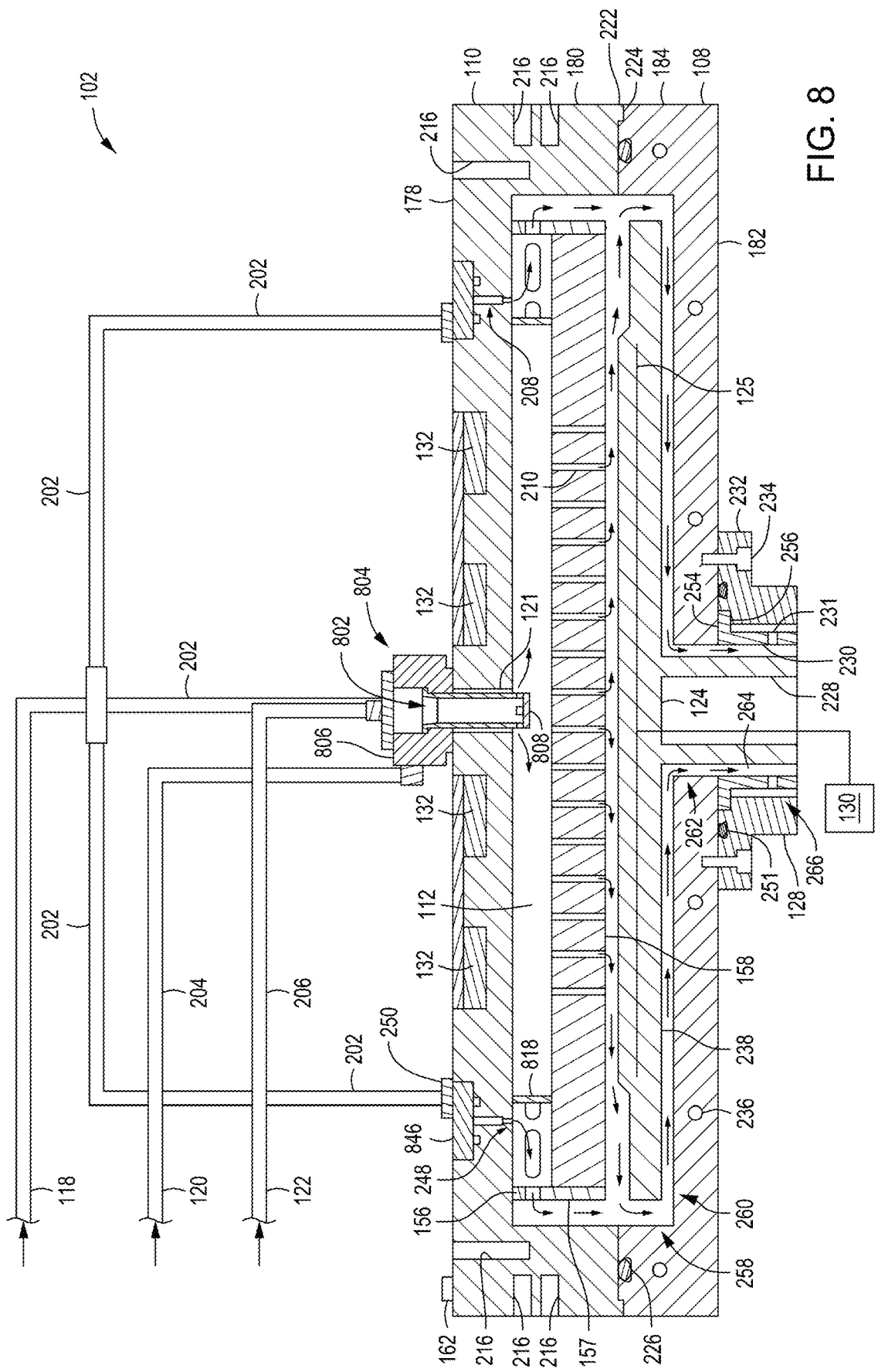
FIG. 8 is a schematic cross-sectional side view of a portion of a part coating reactor in accordance with at least some embodiments of the disclosure.

The lid assembly 110 includes one or more heaters 132. In the embodiment depicted in FIG. 1, two annular heaters 132 are shown. The one or more heaters 132 may be coupled to a heater power source 160. In some embodiments, the one or more heaters 132 comprise ring-shaped heaters disposed in annular channels in the upper surface of the lid assembly 110 (e.g., in a top surface of the top plate 178). For example, as best depicted in FIGS. 2-3 and 8, the one or more heaters 132 are disposed in annular channels formed in the upper surface of the lid assembly 110. An annular cap 212 may be disposed over each of the one or more heaters 132 to retain the heaters within the annular channel. In some embodiments, the annular cap 212 can span over the one or more heaters 132 and one or more coolant channels 134 that may be disposed in the lid assembly 110. As depicted in FIGS. 3, 7, and 12, a plurality of receptacles 306 may be formed in the upper surface of the lid assembly 110 to receive corresponding protrusions 702 from the annular cap 212. The annular cap 212 can be secured to the top plate 178 of the lid assembly 110, for example by a plurality of fasteners 704 (e.g., bolts, screws, or the like).

Returning to FIG. 1, a thermostat 162 may be disposed in or coupled to the lid assembly 110 to monitor the temperature of the lid assembly 110 and, in some embodiments, to facilitate feedback control of the temperature during use. The thermostat 162 may be provided in any suitable location for monitoring the temperature of the lid assembly 110, such as on a side of the lid assembly 110 (as depicted in FIG. 1), or on a top surface of the lid assembly 110 (as depicted in FIGS. 2 and 7).

One or more coolant channels 134 may be provided in at least one of the lower body 108 or the lid assembly 110 to flow a heat transfer medium therethrough. For example, a coolant source 142 can be coupled to the one or more coolant channels 134 to circulate a coolant therethrough. In some embodiments, for example shown in FIG. 8, the one or more coolant channels 134 are disposed only in the lower body 108 and not in the lid assembly 110. In some embodiments, for example shown in FIG. 2, the one or more coolant channels 134 may comprise a first coolant channel formed in a top of the lid assembly 110 with a cap 214 disposed over the first coolant channel. In some embodiments, for example when the one or more heaters 132 comprise a pair of heaters 132, at least one (and in some embodiments all) of the one or more coolant channels 134 may be disposed between the pair of heaters 132. In some embodiments, for example as depicted in FIG. 3, the one or more coolant channels 134 may be a singular annular channel having an inlet 302 and an outlet 304 coupled to a coolant source, such as the coolant source 142 depicted in FIG. 1, for circulating a coolant through the coolant channel 134 (e.g., the singular annular channel). In some embodiments, the coolant source 142 and coolant channels 134 are configured to maintain a temperature of the lid assembly 110 at about 50 to about 75 degrees Celsius.

In some embodiments one or more coolant channels 236 may be provided in the lower body 108 to flow a heat transfer medium therethrough. For example, the coolant source 142 can be coupled to the one or more coolant channels 236 to circulate a coolant therethrough. Alternatively, the one or more coolant channels 236 may be coupled to a different coolant source (not shown). In some embodiments, the coolant source 142 (or other different source) and coolant channels 236 are configured to maintain a temperature of the lower body 108 at about 50 to about 75 degrees Celsius. The small volume and configuration of the coolant channels 134, 236 advantageously facilitate rapid cooldown of the part coating reactor 102 to remove a finished workpiece and load a new workpiece to be coated, thus enhancing throughput.

Returning to FIG. 1, the lid assembly 110 includes a plurality of gas passages 136 disposed therethrough to facilitate providing one or more gases to the interior volume 112 of the part coating reactor 102. A gas source 114 is fluidly coupled to the interior volume 112 via a plurality of conduits 116 coupled to the plurality of gas passages 136 to provide process gases to the interior volume 112 during operation, such as an ALD operation to coat a workpiece (or part) disposed in the interior volume 112, as discussed below. For example, the gas source may include precursor ampoules, one or more inert gases, as well as high speed pulsing valves, purge valves, or the like, to provide deposition gases, carrier gases, purge gases, and the like, for performing an ALD process to coat the workpiece. For example, as shown in FIG. 1, a first conduit 118, a second conduit 120, and a third conduit 122 can be provided to supply three different gases to the interior volume 112, such as for example, a first precursor, a second precursor, and an inert gas. The first conduit 118, the second conduit 120, and the third conduit 122 can be coupled to the interior volume 112 through the lid assembly 110, for example, through the plurality of gas passages 136 and/or through a central opening 121 (discussed in more detail below).

In one non-limiting example, the coating to be formed can be an aluminum oxide ($Al_2O_3$) coating. In such embodiments, for example, the gas source can be configured to provide deposition gases (e.g., precursor gases) including trimethylaluminum (TMA) and water ($H_2O$) along with inert gases, such as nitrogen ($N_2$) or a noble gas, for example, argon (Ar), or the like. Other ALD deposited films can similarly be obtained, such as but not limited to, films with basic formulas such as MOx, MOxFy, MFx, SiOx, SiCx, SiN, M1M2Ox, or the like, wherein M is a metal, M1 is a first metal, and M2 is a second metal different than the first. Such films can be deposited using suitable ALD precursors and deposition processes within the apparatus described herein.

In some embodiments, the part coating reactor 102 is configured to deliver the one or more process gases in a distributed manner. For example, in some embodiments, the part coating reactor 102 is configured to deliver the one or more process gases into a plurality of zones of the interior volume 112. For example, the lid assembly 110 can include a plurality of fluidly independent plenums each coupled to the gas source 114. Each of the fluidly independent plenums are configured to provide one or more process gases to a particular zone of the interior volume 112, wherein at least some of the particular zones are different from each other. The fluidly independent plenums advantageously provide separation of gases to prevent undesired reaction and/or deposition within the conduits or lid assembly 110.

For example, as depicted in FIG. 2, the lid assembly 110 can include an outer annular plenum 208 and one or more inner annular plenums 210. The outer annular plenum 208 facilitates providing one or more gases to a peripheral region of the interior volume 112, and a peripheral region of the workpiece to be coated. In some embodiments, for example, an inert gas may be provided to the outer annular plenum 208 to prevent deposition on the peripheral portion of the workpiece and/or on peripheral portions of the interior volume 112. In the embodiment depicted in FIG. 2, two inner annular plenums 210 are shown. The inner annular plenums facilitate providing one or more gases, such as different deposition or precursor gases for an ALD process, to a more radially inner portion of the interior volume proximate regions of the workpiece that are desired to be coated.

The annular plenums may be formed, for example, by respective annular channels disposed in the top surface of the top plate 178. A cap 246 may be disposed atop each channel to define the respective plenum. A plurality of holes 248 may be provided in each plenum, for example along a bottom surface of the plenum, to fluidly couple the plenum to the interior volume 112. The plurality of holes 248 can be sized and arranged to provide a suitable gas flow from the plenum into the interior volume 112. In some embodiments, the plurality of holes 248 can be equidistantly or substantially equidistantly spaced along the plenum. In some embodiments, the plurality of holes 248 can be arranged into sets of holes, with each set of holes equidistantly or substantially equidistantly spaced along the plenum.

Each of the plenums may be coupled to the gas source 114 via different ones of the first, second, or third conduits 118, 120, 122. For example, a first annular plenum 210A of the one or more inner annular plenums 210 may be coupled to the gas source 114 via the first conduit 118. A second annular plenum 210B of the one or more inner annular plenums 210 may be coupled to the gas source 114 via the second conduit 120. The outer annular plenum 208 may be coupled to the gas source 114 via the third conduit 122.

As best depicted in FIGS. 2 and 7, the first conduit 118 may be coupled to one of the inner annular plenums 210 (e.g., 210A) via a plurality of legs 202 (e.g., a first plurality of legs). Similarly, the second conduit 120 may be coupled to a different one of the inner annular plenums 210 (e.g., 210B) via a different plurality of legs 204 (e.g., a second plurality of legs). Similarly, the third conduit 122 may be coupled to the outer annular plenum 208 via a different plurality of legs 206 (e.g., a third plurality of legs). Each of the plurality of legs 202, 204, 206, are coupled to the respective inner annular plenums 210A, 210B, and outer annular plenum 208 via respective inlets along the plenums, for example as described with respect to FIG. 5.

In some embodiments, one or more of the first conduit 118, the second conduit 120, or the third conduit 122 may be coupled to the respective plenums in a plurality of locations along the plenums. The plurality of locations can be two or more locations, three or more locations, four or more locations, or the like. For example, and as depicted in FIG. 7, the plurality of locations can be six locations.

In some embodiments, at least one, and in some embodiments all, of the first conduit 118, the second conduit 120, or the third conduit 122 are coupled to the respective plenums in an azimuthally symmetric manner. In some embodiments, each of the locations within a respective plenum is equidistantly spaced from adjacent locations within the respective plenum. In some embodiments, none of the plurality of locations are radially aligned with respect to each other. For example, as best shown in FIG. 7, each plenum includes a plurality of inlets (e.g., opening 510 shown in FIG. 5) that can be equidistantly spaced from each other. Each of the inlets in each plenum can be angularly offset with respect to each other. In some embodiments, there are an equal number of inlets in each plenum.

In some embodiments, at least one of a length, a residence time, or a conductance may be equal or substantially equal from the gas source 114 to a respective plenum. For example, in embodiments where a conduit is routed to a plenum at a plurality of locations, one or more of the distance from the gas source, or the residence time for the gas to travel through the conduit, or the overall conductance of the conduit can be equal or substantially equal. As used herein, substantially equal means values within about 10%, or in some embodiments, within about 5% of each other. For example, in embodiments consistent with FIGS. 2 and 7, each of the first, second, and third conduits 118, 120, 122 may split into the respective plurality of legs 202, 204, 206 at junctions that are vertically aligned along a central axis of the interior volume 112 and/or the lid assembly 110. In addition, individual legs within respective ones of the plurality of legs 202, 204, 206 can have equal or substantially equal length and/or conductance. In addition, individual legs within respective ones of the plurality of legs 202, 204, 206 can have equal or substantially equal angular spacing (e.g., such that the locations at which the legs are coupled to the respective annular plenums are equidistantly or substantially equidistantly spaced apart). In some embodiments, legs within a common one of the plurality of legs 202, 204, 206 have horizontal portions disposed in a common plane and vertical portions extending from the common plane to the lid assembly 110, while legs within different ones of the plurality of legs 202, 204, 206 have respective horizontal portions disposed in different planes. Alternatively, legs within a common one of the plurality of legs 202, 204, 206 are disposed in a common space, while legs within different ones of the plurality of legs 202, 204, 206 are disposed in different spaces (e.g., common legs are grouped together and spaced apart from other groups of other legs).

Each of the first, second, or third conduits 118, 120, or 122 may be coupled to the respective plenums via a fitting 250 disposed on the end of each conduit that aligns the conduit with an inlet to the plenum. For example, as depicted in FIG. 2, a fitting 250 is disposed at the end of each of the pluralities of legs 202, 204, 206. As shown in greater detail in FIG. 5, a body 502 of the fitting 250 can be coupled to an end of the first conduit 118 (or leg 202 thereof). A through hole 504 extends through the body in alignment with the first conduit 118 (or leg 202 thereof). A flange 506 May be provided at an end of the body 502 opposite the conduit and may include one or more openings 508 to facilitate coupling the fitting to the lid assembly 110 via mating openings in the lid assembly 110. At the location where the conduit is coupled to the plenum, the cap 246 includes an opening 510 (e.g., a plenum inlet) aligned with the through hole 504 of the fitting 250 to fluidly couple the conduit to the plenum.

Referring back to FIG. 1, in some embodiments, a remote plasma source (RPS) 127 can be coupled to the interior volume 112, for example, via a central opening 121 in the lid assembly 110 to facilitate cleaning of the part coating reactor 102 when desired. Alternatively or in combination, the gas source 114 can be coupled to the interior volume 112 (e.g., via the first conduit 118, the second conduit 120, and the third conduit 122) through the central opening 121. For example, as shown in FIG. 2, the central opening 121 can be coupled to a gas source 240. The gas source 240 can include one or more of the gas source 114 or the RPS 127. In some embodiments, the central opening is coupled to the gas source 240 via a cap 252. In some embodiments, the cap 252 can be configured similar to the cap 246, described above.

In some embodiments, one or more mounting brackets 156 are provided to facilitate coupling a workpiece or part to be coated, such as workpiece 158, to the lid assembly 110. In some embodiments, the workpiece 158 partially defines a processing volume portion of the interior volume 112. For example, in some embodiments, the workpiece 158 can be a showerhead, gas distribution plate (or faceplate), or the like. In such embodiments, the workpiece 158, for example, may comprise a bottom plate having a peripheral lip extending away from the bottom plate to define a central recess within the peripheral lip. A plurality of gas distribution holes 220 are disposed through the bottom plate to facilitate flow of gases from the central recess through the bottom plate and to a space on an opposing side of the bottom plate (e.g., to a processing volume of a chamber having the showerhead installed therein). The workpiece 158 may be coupled to the lid assembly 110 such that a lower surface of the workpiece (such as the bottom plate of a showerhead) is spaced about 1 to about 5 mm, such as about 3 mm apart from a support surface of a pedestal heater 124 disposed in the part coating reactor 102. The showerhead (e.g., workpiece) may include a plurality of openings through the bottom plate, radially outward of the peripheral lip to facilitate coupling the workpiece to the lid assembly 110 via the mounting bracket 156.

For example, in some embodiments, the one or more mounting brackets 156 can be a plurality of posts, such as posts 244 depicted in FIG. 2. In some embodiments, and as depicted in FIG. 2, the workpiece 158 is a showerhead and can be coupled to the lid assembly 110 via the plurality of posts 244. The posts 244 can be inserted, for example, into existing mounting holes in the workpiece 158 and includes through holes for bolting the workpiece to mating threaded openings in the lid assembly 110.

Still with reference to FIG. 2, in some embodiments, a spacer 218 may be provided to facilitate maintaining a gap between the workpiece 158 and the lid assembly 110. The gap between the workpiece 158 and the lid assembly 110 facilitates gas flow therebetween, e.g., over surfaces of the workpiece 158 during use. In some embodiments, the spacer 218 may be configured to align with the workpiece 158. For example, the spacer 218 may include features that interface with corresponding features of the workpiece 158, such as peripheral edges of the workpiece 158. For example, in embodiments where the workpiece 158 is circular, the spacer 218 may be an annular ring having a radially outer lip such that the spacer 218 can be disposed atop the workpiece along the peripheral edge thereof, with the radially outer lip extending along the sidewall of the workpiece 158. The spacer 218 may further facilitate forming a seal between the workpiece 158 and the lid assembly 110 such that gases provided to the interior volume 112 substantially flow toward and over the surfaces of the workpiece 158 disposed radially inward of the spacer 218, and not around the radially outer surfaces of the workpiece 158. In some embodiments, the spacer is made of polyetheretherketone (PEEK), aluminum or an aluminum alloy (such as AL6061 or AL1005), or similar materials.

In some embodiments, the part coating reactor 102 is configured to coat a workpiece of a given size. For example, where the workpiece 158 is a showerhead, the showerhead can be configured for use in a process chamber configured for processing a substrate of a predetermined size. For example, the workpiece 158 can be a showerhead configured for processing a semiconductor wafer, such as a 150 mm, 200 mm, 300 mm, or the like diameter semiconductor wafer, or a rectangular substrate such as for solar, display, or other applications. As such, the spacer 218 has a size such that the spacer 218 is disposed between the outer annular plenum 208 and one or more inner annular plenums 210. In operation, for example, process gases for a deposition process (e.g., deposition gases), such as an ALD deposition process, may be provided to the one or more inner annular plenums 210 (or through the central opening 121), while an inert gas, such as a noble gas, for example argon, can be provided to the outer annular plenum 208. Process gases provided to the one or more inner annular plenums 210 (or through the central opening 121) thus flow over radially inner (relative to the spacer 218) surfaces of the workpiece 158, and through openings in the workpiece 158 (such as gas distribution holes 220) to coat the workpiece with material from the deposition process. The process gases provided to the one or more inner annular plenums 210 (or through the central opening 121) are substantially prevented from flowing radially outward of the spacer 218 and over radially outer surfaces (relative to the spacer 218) of the workpiece 158. Similarly, gases, such as an inert gas, provided to the outer annular plenum 208 flows over the radially outer surfaces of the workpiece 158 and are substantially prevented from flowing over radially inner surfaces of the workpiece 158. An inert gas provided to the outer annular plenum 208 further limits or prevents deposition of materials along outer sidewalls of the lid assembly 110. Illustration of gas flows into the part coating reactor 102 is depicted by arrows shown in FIGS. 2, 8, and 5. Illustration of gas flows out of the part coating reactor is depicted by arrows shown in FIGS. 2 and 6.

Figure 5:
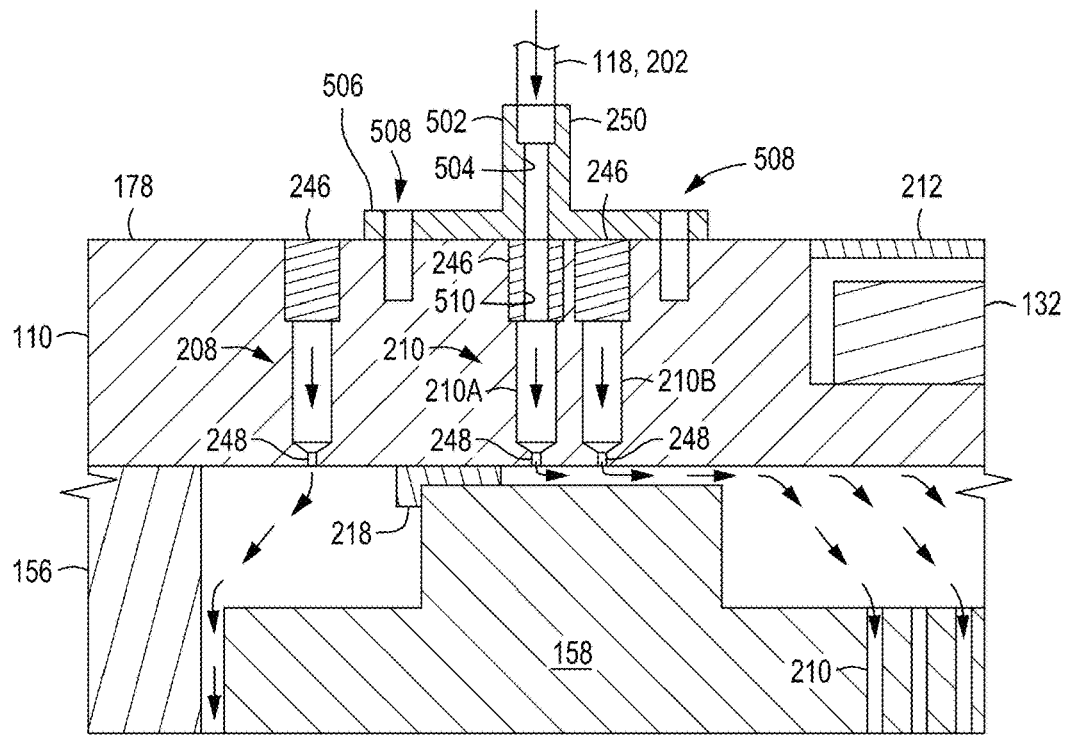
FIG. 5 is a schematic cross-sectional side view of a portion of a part coating reactor in accordance with at least some embodiments of the disclosure.
Figure 13A:
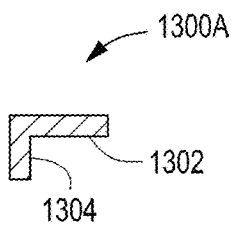
FIGS. 13A-13O respectively depict schematic cross-sectional side views of a spacer of a part coating reactor in accordance with at least some embodiments of the disclosure.

The spacer 218 depicted in FIGS. 2 and 5 is illustrative and the spacer may have other configurations based upon the geometry of the workpiece 158 and/or based upon the geometry of the lid assembly 110. For example, FIGS. 13A-13O depicted three non-limiting examples of spacers suitable for use in accordance with the present disclosure. As shown in FIG. 13A, a spacer 1300A is shown having a configuration similar to the spacer 218 depicted in FIG. 2. The spacer 1300A has an annular body having a form factor suitable to closely surround the workpiece 158 when installed. The annular body includes a flat disc 1302 having an outer lip 1304 extending downward from an outer edge of the flat disc 1302. For example, in use, the flat disc 1302 can be disposed atop the workpiece 158 with the outer lip 1304 extending downward along the sides of the workpiece 158. The spacer 1300A thus at least one of defines the distance between the workpiece 158 and the lid assembly 110, or partially defines an inner enclosure between the workpiece 158 and the lid assembly 110 that prevents or limits gas flow radially outward past the spacer 1300A.

Figure 13B:
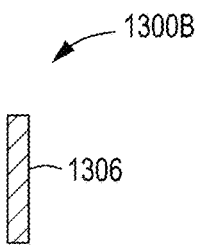
Figure 13C:
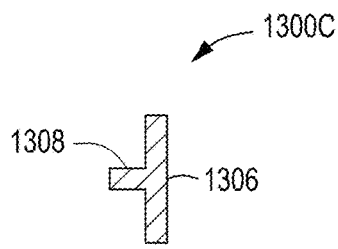

As shown in FIG. 13B, a spacer 1300B is shown having a configuration similar to the spacer 818 depicted in FIG. 8. The spacer 1300B has an annular body 1306 having a diameter less than the workpiece 158 when installed. The annular body 1306 may have a sidewall that is elongate in an axial direction corresponding with an axis extending centrally through the opening of the annular body 1306. For example, in use, the annular body 1306 can be disposed atop the workpiece 158, for example, within a groove (such as an o-ring groove) disposed atop the workpiece 158. In some embodiments, the annular body 1306 may similarly interface with an annular groove disposed in the lid assembly 110 (for example as depicted in FIG. 8). The spacer 1300B thus at least one of defines the distance between the workpiece 158 and the lid assembly 110, or partially defines an inner enclosure between the workpiece 158 and the lid assembly 110 that prevents or limits gas flow radially outward past the spacer 1300B. In some embodiments, and as depicted in FIG. 13C, a spacer 1300C can be provided similar to the spacer 1300B, but may further include an annular protrusion or rib 1308 extending from the annular body 1306 to provide greater structural integrity to the spacer 1300C.

Returning to FIG. 1, in some embodiments, a liner 157 is provided to surround the workpiece or part to be coated (e.g., workpiece 158) to protect the lid assembly 110. The liner 157 can have any suitable shape to surround the workpiece 158 and protect the inner sidewalls of the lid assembly 110 (e.g., the outer periphery of the interior volume adjacent to the lid assembly). For example, the general shape of the inner periphery of the liner can be configured to surround a workpiece having a given shape or size in order to surround the workpiece and fill the air gaps or space between the workpiece and the sidewalls of the part coating reactor 102, for example the sidewalls of the lid assembly 110.

Figure 4:
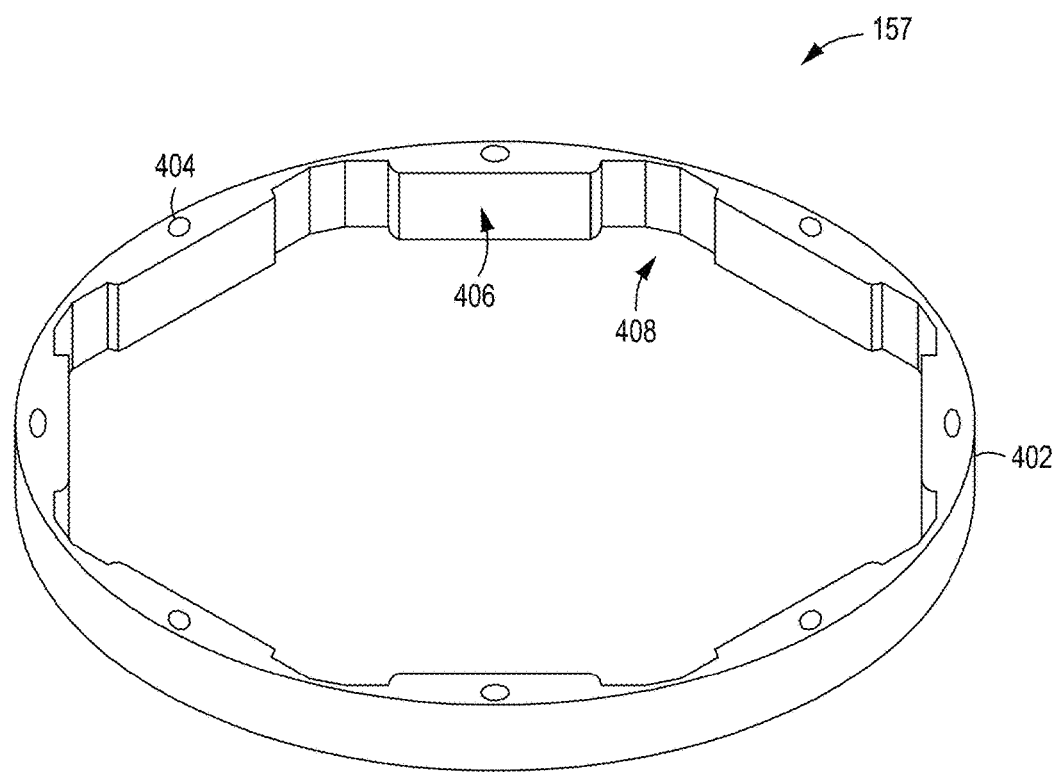
FIG. 4 is a top isometric view of a chamber liner for a part coating reactor in accordance with at least some embodiments of the disclosure.

In some embodiments, and as depicted in FIG. 4, the liner 157 can have an annular body 402 with an alternating plurality of flat surfaces 406 and recessed portions 408 along the inner wall of the annular body 402. A plurality of openings 404 may be provided through the annular body 402 to facilitate coupling the liner 157 to the bottom surface of the lid assembly 110. The liner 157 can be fabricated from any process compatible materials, such as aluminum.

Figure 10:
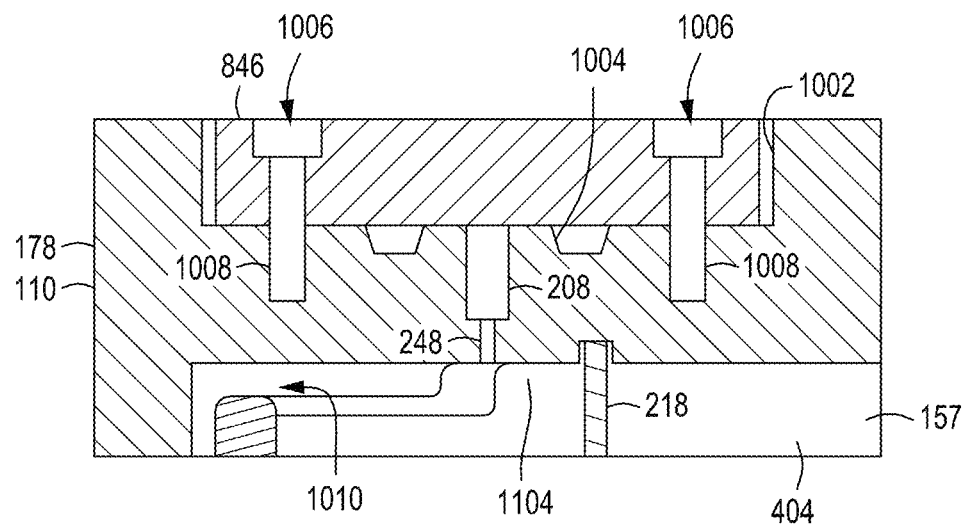
FIG. 10 is a schematic cross-sectional side view of a portion of a part coating reactor in accordance with at least some embodiments of the disclosure.
Figure 11:
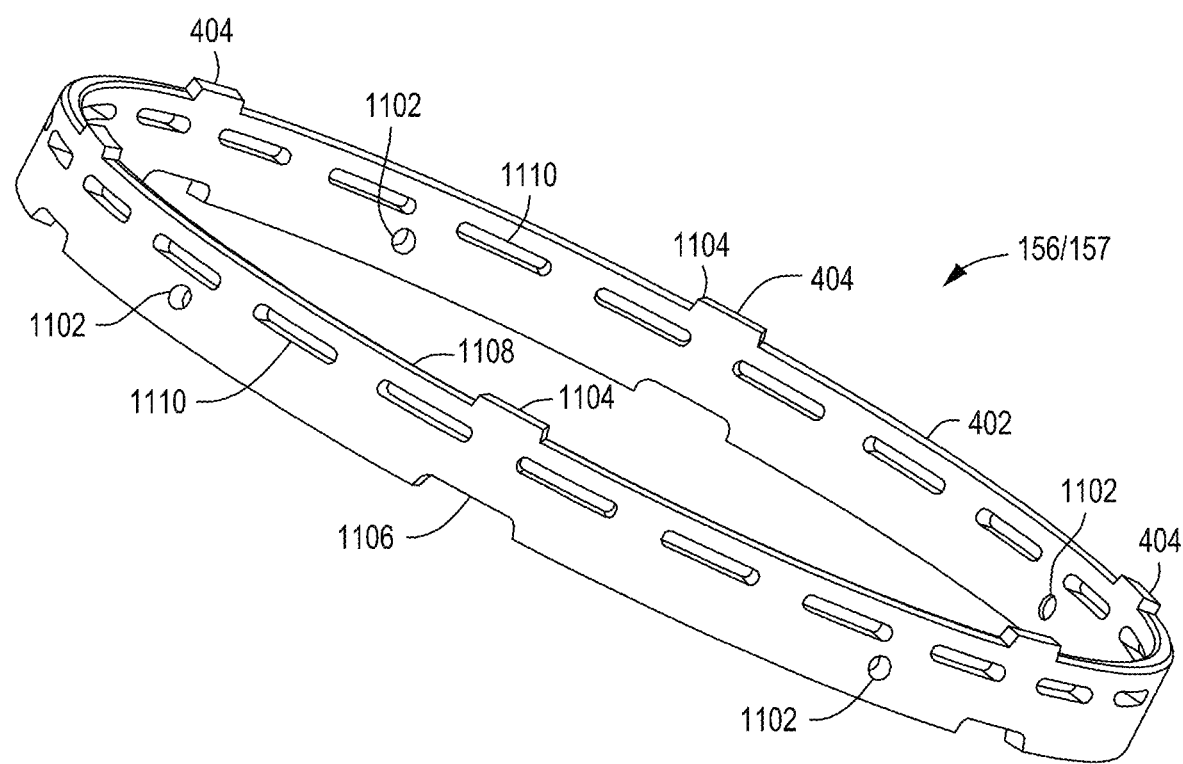
FIG. 11 is a top isometric view of a chamber liner for a part coating reactor in accordance with at least some embodiments of the disclosure.

In some embodiments, and as depicted in FIG. 11, the liner 157 and the mounting bracket 156 can be combined into a singular component. For example, in such embodiments, the liner 157 can have an annular body 402 with a plurality of openings 404 provided through the annular body 402 to facilitate coupling the liner 157 to the bottom surface of the lid assembly 110. The liner 157 further includes a plurality of opening 1102 configured to receive a fastener, such as a set screw, a grub screw, or the like, to secure the liner 157 to the workpiece 158, and therefore to secure the workpiece 158 to the lid assembly 110. The plurality of openings 404 may be provided on raised portions 1104 (e.g., protrusions) that provide a stand-off for the liner 157 such that a gap (e.g., gap 1010 depicted in FIG. 10) is defined between the upper surface 1108 of the annular body 402 and the lower surface of the lid assembly 110. The gap facilitates flow of gas around the liner 157 to the exhaust. A recessed portion 1106 may be provided opposite each raised portion 1104, for example, to facilitate receiving a head of the fastener passing through the respective opening 404 in the annular body 402. The liner 157 may include a plurality of through holes 1110 formed through the sidewall of the annular body to further facilitate flow of gas around the liner 157 to the exhaust.

Figure 6:
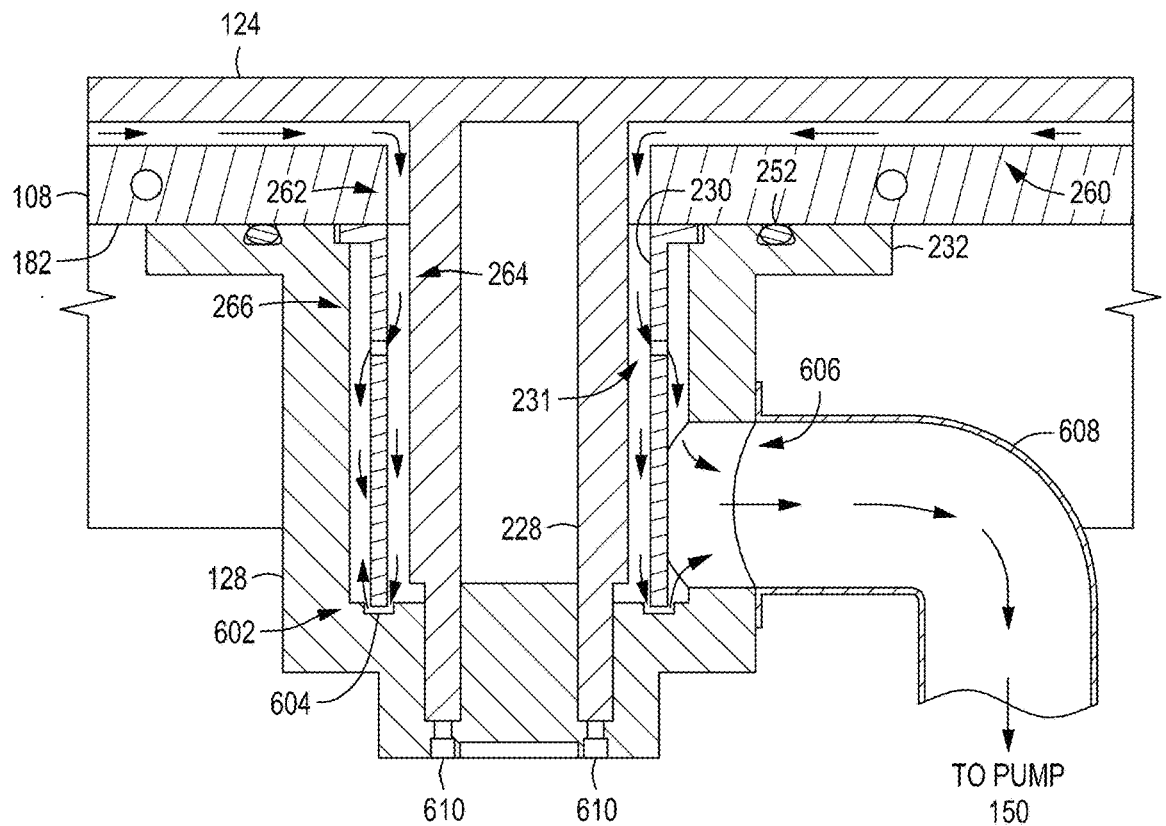
FIG. 6 is a schematic cross-sectional side view of a portion of a part coating reactor in accordance with at least some embodiments of the disclosure.

Returning to FIG. 1, the lower body 108 is sized and configured to receive a pedestal heater 124. For example, the lower body 108 may include an opening 126 formed through the bottom plate 182 to receive a shaft (e.g., shaft 228 depicted in FIG. 2) of the pedestal heater 124. A pedestal hub 128 can be coupled to the bottom plate 182 to surround and enclose the shaft of the pedestal heater 124. In some embodiments, the shaft of the pedestal heater 124 may be coupled to and supported by the pedestal hub 128 such that a bottom surface of the pedestal heater 124 is disposed above and opposing top surface of the bottom plate 182 of the lower body 108. For example, as depicted in FIG. 6, one or more openings 610 can be provided through the pedestal hub 128 to fasten the shaft 228 of the pedestal heater 124 to the pedestal hub 128. Returning to FIG. 1, a pedestal heater power supply 130 is coupled to a heater electrode 125 disposed in the pedestal heater 124, for example, through the pedestal hub 128, to power the pedestal heater 124 during use. The heater electrode 125 can be configured in one or a plurality of zones, such as two zones. In some embodiments, the pedestal heater 124 is configured to heat up to about 600 degrees Celsius (e.g., in a range of about 100 to about 600, or about 200 to about 500 degrees Celsius) at a rate of up to about 5 degrees Celsius per minute.

As shown in more detail in FIG. 2, the pedestal heater 124 may include a heater plate 238 and a central shaft 228. The heater plate 238 includes the heater electrode 125 and may include a substantially planar upper surface. In some embodiments, the heater plate may be configured to support a planar substrate, such as a semiconductor wafer or the like. In some embodiments, the heater plate 238 may include a planar or substantially planar raised upper surface and a substantially planar ledge disposed radially outward of the raised upper surface. The pedestal heater 124 can have a diameter that is larger than the workpiece 158 to be coated. For example, the pedestal heater 124 can have a diameter that is larger than at least an inner diameter of the liner 157. In some embodiments, the pedestal heater 124 can have a diameter of about 500 to about 600 mm.

The lower body 108 is sized to define a small gap between the pedestal heater 124 and interior volume 112 facing surfaces of the lower body 108. For example, a first gap 258 is formed between the inner surface of the sidewall 184 and the outer peripheral edge of the heater plate 238. In some embodiments, the first gap 258 can be about 2 to about 4 mm, such as about 3 mm. A second gap 260 is formed between the upper surface of the bottom plate 182 and an opposing lower surface of the heater plate 238. In some embodiments, the second gap 260 can be about 3 to about 6 mm, such as about 4 mm. The opening 126 is larger than the outer diameter of the shaft 228 such that a third gap 262 is formed between the opening 126 and the shaft 228. In some embodiments, the third gap 262 can be about 3 to about 6 mm, such as about 4 mm.

The pedestal hub 128 is coupled to the lower body 108 about the shaft 228 and opening 126. The pedestal hub 128 can be bolted or otherwise fastened to the lower body 108, for example, using a plurality of fasteners disposed through a corresponding plurality of openings 234 formed in a flange 232 of the pedestal hub 128 and extending into corresponding threaded openings of the lower body 108. In some embodiments, one or more grooves 251 may be provided in either or both of the pedestal hub 128 or the lower body 108 to facilitate forming a seal therebetween. For example, a gasket, such as in O-ring, may be disposed in the groove 251.

The pedestal hub 128 has an inner diameter that is larger than the outer diameter of the shaft 228. In some embodiments, the pedestal hub has an inner diameter that is larger than that of the opening 126. In some embodiments, and as depicted in FIG. 2, a choke cup 230 may be provided to regulate the flow the exhaust of gases leaving the interior volume 112. The choke cup 230 can be disposed between the pedestal hub 128 and the lower body 108. The choke cup 230 provides flow conductance choke points to regulate the flow exiting the part coating reactor 102 to be more azimuthally uniform. For example, the choke cup 230 may be a tubular member including a flange 254 that may rest on a corresponding ledge 256 formed along the inner diameter of the pedestal hub 128. The flange 254 may have a thickness that is equal to or substantially equal to a height of the ledge 256 such that the flange 254 rests against the bottom of the lower body 108 when the pedestal hub 128 is coupled thereto.

The choke cup 230 may have an inner diameter that is substantially equal to the inner diameter of the opening 126 to define a fourth gap 264 between the inner surfaces of the choke cup 230 and the outer surface of the shaft 228. The choke cup 230 further has an outer diameter that is less than an inner diameter of the pedestal hub 128 such that a fifth gap 266 is defined therebetween. The choke cup 230 further includes a plurality of openings 231 formed therethrough to fluidly couple the fourth gap 264 to the fifth gap 266.

As shown in greater detail in FIG. 6, the choke cup 230 may have a length such that a bottom of the choke cup 230 is spaced apart from a bottom inner surface of the pedestal hub 128 to define a sixth gap 602 therebetween. In some embodiments, a groove 604 may be formed in a bottom surface of the interior of the pedestal hub 128 having a width that is greater than a wall thickness of the choke cup 230. A bottom of the choke cup 230 may extend partially into the groove such that the sixth gap 602 is defined between sidewalls and bottom of the groove and the portion of the wall of the choke cup 230 extending partially into the groove.

An opening 606 may be formed in the pedestal hub 128 to facilitate coupling the pedestal hub 128 to an exhaust assembly of the part coating reactor 102 (e.g., exhaust assembly 144 described below). For example, the opening 606 may be fluidly coupled to the fifth gap 266. A conduit 608 can couple the opening 606 to the pump 150 via the exhaust assembly.

Returning to FIG. 1, the exhaust assembly 144 of the part coating reactor 102 is fluidly coupled to the interior volume 112 through the pedestal hub 128 (for example, through opening 606 described with respect to FIG. 6). The exhaust assembly 144 includes a throttle valve 146 disposed in line along a conduit 148 coupling a pump 150 to the interior volume 112. The throttle valve 146 facilitate control of the pressure within the interior volume 112. A pressure gauge 152 may also be coupled to the conduit 148 to monitor a pressure in the conduit 148 (and, by relation, the pressure within the interior volume). In some embodiments, additional valves, for example such as an isolation valve 154, a bypass valve 155, or the like, may be provided to facilitate isolating and/or disconnecting the part coating reactor 102 from the conduit 148 and pump 150, for example for maintenance.

The part coating system 100 may also include a controller 170 coupled to the part coating reactor 102. The controller 170 controls the operation of the part coating reactor 102 using a direct control or alternatively, by controlling the computers (or controllers) associated with the part coating reactor 102. In operation, the controller 170 enables data collection and feedback to optimize performance of the part coating reactor 102. The controller 170 generally includes a central processing unit (CPU) 172, a memory 174, and support circuits 176. The CPU 172 may be any form of a general-purpose computer processor that can be used in an industrial setting. The support circuits 176 are conventionally coupled to the CPU 172 and may comprise a cache, clock circuits, input/output subsystems, power supplies, and the like. Software routines, such as methods as described herein may be stored in the memory 174 and, when executed by the CPU 172, transform the CPU 172 into a specific purpose computer (controller 170). The software routines may also be stored and/or executed by a second controller (not shown) that is located remotely from the part coating reactor 102.

The memory 174 is in the form of computer-readable storage media that contains instructions, when executed by the CPU 172, to facilitate the operation of the part coating reactor 102. The instructions in the memory 174 are in the form of a program product such as a program that implements the apparatus of the present disclosure. The program code may conform to any one of a number of different programming languages. In one example, the disclosure may be implemented as a program product stored on a computer-readable storage media for use with a computer system. The program(s) of the program product define functions of the aspects. Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the part coating reactor 102 described herein, for example in accordance with method 1400, are aspects of the present disclosure.

Additional details of a part coating reactor in accordance with at least some embodiments of the disclosure are shown in FIG. 2, which is a schematic cross-sectional side view of a portion of a part coating reactor, such as the part coating reactor 102. As depicted in FIG. 2, the lid assembly 110 is coupled to the lower body 108 to at least partially define the interior volume 112. In some embodiments, a seal may be provided at the interface between the lid assembly 110 and the lower body 108. For example, a groove 226 may be provided in one or more of the lid assembly 110 or the lower body 108 to receive a gasket, for example an O-ring, to facilitate maintaining a seal between the lid assembly 110 and the lower body 108 when assembled. In some embodiments, one or more alignment features may be provided to facilitate the alignment and interconnection of the lid assembly 110 and the lower body 108. For example, a protrusion or lip 222 may be disposed around a peripheral edge of one of the lid assembly 110 or the lower body 108. A mating recess 224 may be provided in the other of the lid assembly 110 or the lower body 108 to receive and interface with the lip 222. In the embodiment depicted in FIG. 2, the lip 222 is shown protruding downward from the lid assembly 110 and the mating recess 224 is shown formed in the peripheral edge of the lower body 108.

In some embodiments, one or more thermal conduction chokes may be provided in the lid assembly 110 to facilitate reduction of heat transfer away from the upper central portion of the lid assembly, above the interior volume 112. For example, a plurality of recesses 216 may be formed in the lid assembly 110 to interfere with conductive heat transfer through the lid assembly 110. In some embodiments, the plurality of recesses 216 comprise elongate slots. The plurality of recesses 216 can be formed in either or both of the upper surface or side surfaces of the lid assembly 110.

In the embodiment depicted in FIG. 2, and as shown more clearly in FIGS. 3 and 7, a first plurality of recesses 216 (first plurality of recesses 316A in FIG. 3) may be formed in the top surface of the lid assembly 110. The first plurality of recesses 216 (316A) may be arranged, for example, along a circle proximate an outer peripheral edge of the lid assembly 110 and radially outward of the interior volume 112. In some embodiments, the first plurality of recesses 216 (316A) may be elongate slots having major axes aligned or substantially aligned with the circle along which they are disposed (e.g., tangentially aligned with the circle, for example, at the center of the elongate slot).

In the embodiment depicted in FIG. 2, and as shown more clearly in FIG. 3, a second plurality of recesses 216 (second plurality of recesses 316B in FIG. 3) may be formed in the side surface of the lid assembly 110. The second plurality of recesses 216 (316B) may be arranged, for example, along one or more circular rows (two circular rows shown in the Figures) along the outer peripheral edge of the lid assembly 110. In embodiments where more than one circular row of recesses are provided, the recesses in each row may be staggered or overlap to reduce the pathways for conductive heat transfer from the top surface of the lid assembly 110 down the side surface of the lid assembly 110 (e.g., to form a tortuous path for thermal conduction). In some embodiments, the second plurality of recesses 216 (316B) may be elongate slots having major axes aligned or substantially aligned with the circular row along which they are disposed.

The foregoing description of various components of the parts coating reactor 102 is exemplary and other variations are possible within the scope of the present disclosure. For example, FIGS. 8-10 and 12 depict a lid assembly 110 in accordance with at least some embodiments of the present disclosure that differs from the lid assembly 110 depicted in FIGS. 2-5 and 7. Portions of the lid assembly that are similar to those previously described above with respect to FIGS. 2-5 and 7 have identical reference numerals and may not be separately described below.

In some embodiments, and as depicted in FIGS. 8-10 and 12, the part coating reactor 102 is configured to deliver the one or more process gases into an outer zone and a central zone. For example, the plurality of fluidly independent plenums of the lid assembly 110 may be coupled to the gas source 114 such that reactive gases can be provided to the central opening 121 of the lid assembly 110 and one or more inert gases can be provided to the outer annular plenum 208. As noted above, portions of the embodiment depicted in FIGS. 8-10 and 12 that are similar to the embodiment depicted in FIGS. 2, 3, and 7 have similar reference numerals to corresponding elements discussed herein with respect to FIGS. 2, 3, and 7.

As described above with respect to FIG. 2, the lid assembly 110 shown in FIG. 8 includes an outer annular plenum 208 and a central plenum 802. The outer annular plenum 208 facilitates providing one or more gases to a peripheral region of the interior volume 112, and a peripheral region of the workpiece 158 to be coated. In some embodiments, for example, an inert gas may be provided to the outer annular plenum 208 to prevent deposition on the peripheral portion of the workpiece and/or on peripheral portions of the interior volume 112. The central plenum 802 facilitates providing one or more gases, such as different deposition or precursor gases for an ALD process, to a radially inner portion of the interior volume (e.g., a central portion) proximate regions of the workpiece that are desired to be coated.

The central plenum 802 is disposed in the central opening 121 and facilitates providing one or more gases to a central region of the interior volume 112, and a central region of the workpiece 158 to be coated. For example, the central plenum 802 can be coupled to the gas source 114 via different ones of the first, second, or third conduits 118, 120, 122. In some embodiments, the outer annular plenum 208 can be coupled to the gas source 114, for example, via the first conduit 118 to provide, for example, an inert gas to the outer plenum 208. The central plenum 802 can be coupled to the gas source 114, for example, via the second and third conduits 120, 122 to provide, for example, precursors for an ALD process to coat the workpiece 158.

The central plenum 802 can include a nozzle assembly 804 to facilitate distribution of the process gases to the interior volume 112. The nozzle assembly can include a body 806 having an interior opening 910 into which a nozzle 808 can be inserted and retained. For example, the nozzle 808 can be inserted into the interior opening 910 and may have an upper flange that can rest upon a corresponding shoulder formed in the interior opening 910. A cap 908 can be coupled to the top of the body 806 to cover the top of the interior opening 910. One or more o-ring grooves 912 (one shown) can be provided in facing surfaces of at least one of the cap 908 or the body 806 to minimize or prevent leaks from the central plenum 802 along the interface of the body 806 and the cap 908.

Figure 9:
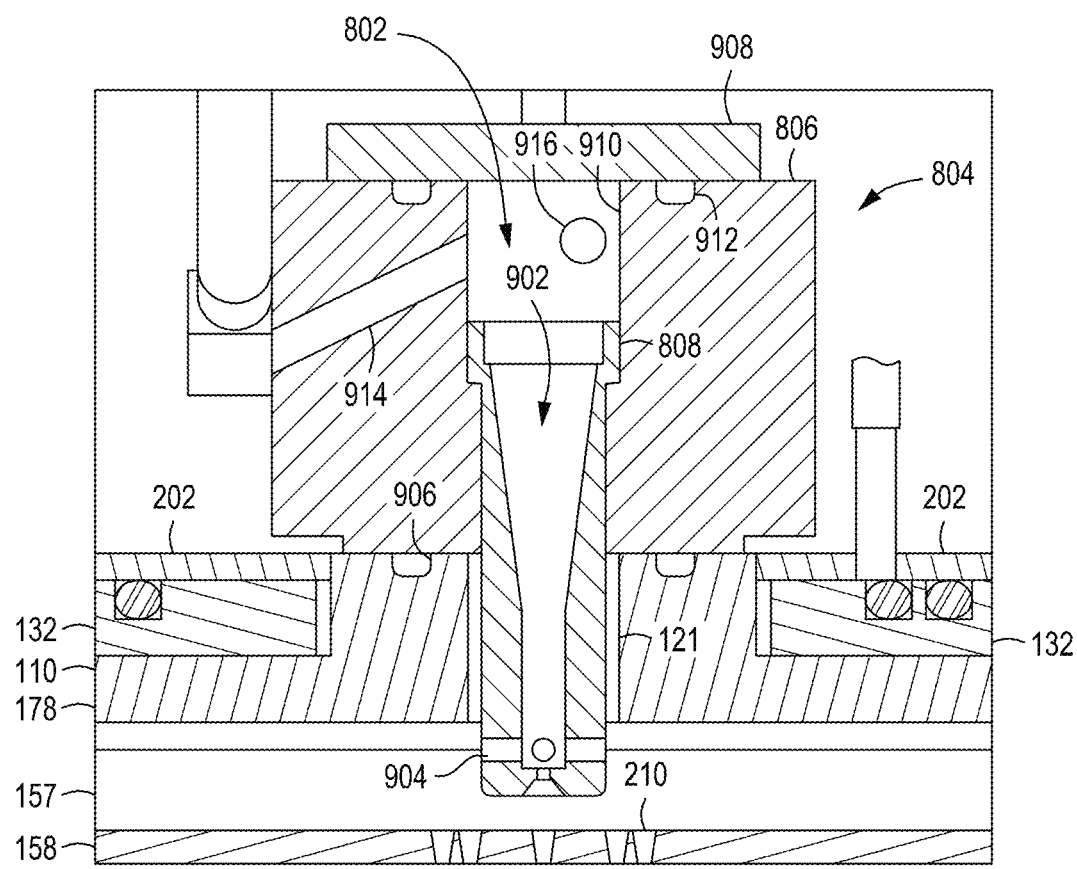
FIG. 9 is a schematic cross-sectional side view of a portion of a part coating reactor in accordance with at least some embodiments of the disclosure.

As best depicted in FIG. 9, the body 806 of the nozzle assembly 804 may be mounted to the lid assembly 110, for example, by a plurality of fasteners such as screws, bolts, clamps, or the like (not shown). One or more o-ring grooves 906 (one shown) can be provided in facing surfaces of at least one of the lid assembly 110 or the body 806 to minimize or prevent leaks from the central plenum 802 along the interface of the body 806 and the lid assembly 110.

One or more passageways may be provided to the central plenum 802, for example through the body 806, the cap 908, or a combination of the body 806 and the cap 908. As depicted in FIG. 9, in some embodiments, a passageway 914 may be provided to couple one of the conduits (e.g., 118, 120, 122) to the central plenum 802, and an independent second passageway 916 may be provided to couple a different one of the conduits (e.g., 118, 120, 122) to the central plenum 802.

The body 806 and the nozzle 808 together define the central plenum 802. For example, the nozzle 808 includes an interior passageway 902 terminating at a bottom of the nozzle 808. One or more holes (e.g., holes 904 in FIG. 9) are disposed in a bottom portion of the nozzle 808 in fluid communication with the interior passageway 902. In some embodiments, the one or more holes 904 are a plurality of holes. In some embodiments, the plurality of holes are four holes. The plurality of holes can be equidistantly spaced with respect to each other. The one or more holes can be provided in a bottom surface of the nozzle 808, in a lower portion of the sidewall of the nozzle 808, or in a combination of the two. The nozzle 808 can extend beyond the bottom surface of the lid assembly 110 and into the interior volume 112.

As best depicted in FIG. 10, the outer plenum 208 can be formed by an annular channel disposed in the top plate 178 of the lid assembly 110. A plurality of holes 248 may be provided in the outer plenum 208, for example along a bottom surface of the plenum, to fluidly couple the plenum to the interior volume 112. The plurality of holes 248 may be as described above. A cap 846 may be disposed atop each channel to define the outer plenum 208 and may be coupled to the top plate 178 via a plurality of fasteners (e.g., screws or the like). For example, a plurality of holes 1006 may be formed through the cap 846 and aligned with corresponding threaded holes 1008 formed in the top plate 178 to receive fasteners to secure the cap 846 to the top plate 178.

The cap 846 can be disposed within a recess 1002 formed in the top plate 178. In some embodiments, the recess 1002 and cap 846 may be sized such that the cap 846 is flush with, or does not protrude above, the top surface of the top plate 178. One or more o-ring grooves 1004 may be formed in facing surfaces of at least one of the top plate 178 or the cap 846 to receive an o-ring to facilitate reducing or eliminating leaks from the outer plenum 208. The outer plenum 208 can be coupled to the gas source 114 via one or more of the first, second, or third conduits 118, 120, 122 (for example, one conduit to provide one or more inert gases) through the cap 846 similar to as described above with respect to FIG. 5.

In operation, when gases are flowing through the part coating reactor 102, the gases initially flow into the parts coating reactor 102 through the lid assembly 110. For example, gases can be introduced through at least one of the gas passages 136 or the opening 126. The gases then flow around the workpiece. In some embodiments, the workpiece is the workpiece 158, such as a showerhead, coupled to the lid assembly 110. In such embodiments, the gas flows across surfaces of the workpiece, such as into a central recess of the showerhead, through a plurality of gas distribution holes disposed through the showerhead, then between the face of the showerhead and across the pedestal heater 124. The gases then flow around peripheral edges of the pedestal heater 124 (e.g., through first gap 258), between the bottom of the pedestal heater 124 and the floor of the lower body 108 (e.g., through second gap 260), and are exhausted out of the interior volume 112 through a location beneath the pedestal heater 124, such through the choke cup 230 and pedestal hub 128 (e.g., through the third gap 262, fourth gap 264, and fifth gap 266 or sixth gap 602). A pump, such as the pump 150 is coupled to the interior volume 112, for example, through opening 606 in the pedestal hub 128.

Figure 14:
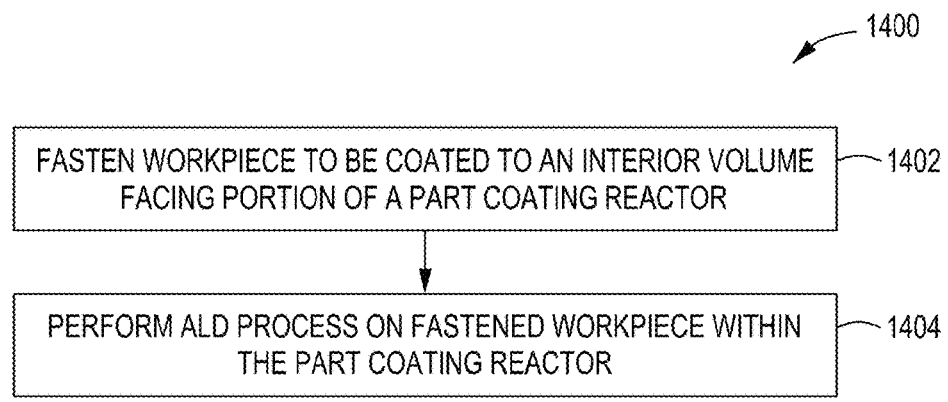
FIG. 14 is a flow chart of a method of coating a part in a part coating reactor in accordance with at least some embodiments of the disclosure.

For example, FIG. 14 is a flow chart of a method 1400 of coating a part in a part coating reactor in accordance with at least some embodiments of the disclosure. The method 1400 generally begins at 1402 where a workpiece is fastened to be coated to an interior volume facing portion of a part coating reactor. In some embodiments, where the part being coated is a component of a semiconductor substrate processing chamber, the coating process is performed on the part itself (e.g., the workpiece is the part being coated) and, as such, the coating process is performed without a conventional substrate (e.g., a semiconductor wafer or the like) disposed on the substrate support (e.g., pedestal heater 124) during the deposition process.

In some embodiments, the workpiece can be the workpiece 158, such as, for example, a showerhead. For example, the workpiece 158 can be fastened to the lid assembly 110 as described above. In some embodiments, a spacer (such as the spacer 218) can be disposed between the workpiece and the lid assembly.

In some embodiments, the workpiece (e.g., part to be coated) can be a substrate support pedestal configured to support a planar substrate, such as the pedestal heater 124 described above. For example, the substrate support pedestal can be coupled to a lower body 108 of the part coating reactor 102 such that a support surface of the substrate support pedestal is disposed in the interior volume 112 opposite the lid assembly 110. In such embodiments, the process can be performed without fastening any workpiece 158 (such as a showerhead) to the lid assembly 110.

Next, at 1404, an ALD process is performed on the fastened workpiece within the part coating reactor. The ALD process can be any suitable ALD process to form a coating on the workpiece (e.g., a showerhead, a substrate support pedestal, or the like).

In one example, the coating to be formed can be an aluminum oxide ($Al_2O_3$) coating. In such embodiments, the ALD process includes providing a pulse of trimethylaluminum (TMA) followed by flow of an inert purge gas, for example, through the first annular plenum 210A, then subsequently providing a pulse of water ($H_2O$) followed by flow of the purge gas, for example, through the second annular plenum 210B. In some embodiments, the pulse of trimethylaluminum (TMA) can be provided for about 30 to about 1000 milliseconds (ms), such as less than about 100 ms, followed by an about 100 ms to about 2000 ms, or in some embodiments about 200 to about 1000 ms, such as an about 1 second flow of the purge gas. In some embodiments, the pulse of water ($H_2O$) can be provided for about 30 to about 1000 milliseconds (ms), such as less than about 100 ms, followed by an about 100 ms to about 5000 ms, or in some embodiments about 500 to about 5000 ms, such as an about 3.5 second flow of the purge gas. The ALD process can be performed at a reaction pressure of about 1 to about 10 Torr, such as about 2-3 Torr. The ALD process can also be performed at a temperature of about 300 degrees Celsius. The purge gas is an inert gas, such as nitrogen ($N_2$) or a noble gas, for example, argon (Ar), or the like. The ALD process can be repeated as desired to form a coating having a desired thickness.

For example, in some embodiments the ALD process includes alternately flowing deposition gases through the lid assembly 110 across the workpiece. The process gases can be exhausted through the exhaust assembly of the part coating reactor. In some embodiments, where the workpiece is a showerhead, the deposition gases are flowed into a central recess of the showerhead, through a plurality of gas distribution holes disposed through the showerhead, then between the face of the showerhead and across the pedestal heater 124. The deposition gases are exhausted out of the interior volume through a location beneath the pedestal heater 124, such as described above. In some embodiments, performing the ALD process further comprises flowing an inert gas around a peripheral edge of the showerhead while alternately flowing the deposition gases.

In some embodiments, wherein the workpiece comprises the substrate support pedestal, performing the ALD process comprises alternately flowing deposition gases through the lid assembly and across an upper surface of the substrate support pedestal. The deposition gases then flow around the peripheral edges of the substrate support pedestal and are exhausted out of the interior volume through a location beneath the substrate support pedestal, such as described above. In some embodiments, performing the ALD process further comprises flowing an inert gas around a peripheral edge of the substrate support pedestal while alternately flowing the deposition gases.

The inventors have observed that the deposition time required for coating a single part (e.g., workpiece) in a part coating reactor as described herein is advantageously reduced as compared to conventional batch coating processes currently used to coat such process chamber parts.

While the foregoing is directed to embodiments of the present disclosure, other and further embodiments of the disclosure may be devised without departing from the basic scope thereof.

The invention claimed is:

1. A part coating reactor, comprising:
  a lower body and a lid assembly that together define and enclose an interior volume;
  one or more heaters disposed in the lid assembly;
  one or more coolant channels disposed in the lid assembly to flow a heat transfer medium therethrough;
  a plurality of gas passages disposed through the lid assembly to facilitate providing one or more gases to the interior volume, wherein the plurality of gas passages include a plurality of fluidly independent plenums disposed in the lid assembly, and wherein each fluidly independent plenum includes a plurality of holes disposed along a bottom surface of the plenum and extending to a lower surface of the lid assembly to fluidly couple the plenum to the interior volume; and
  one or more mounting brackets to facilitate coupling a workpiece to be coated to the lower surface of the lid assembly beneath the plurality of holes.

2. The part coating reactor of claim 1, further comprising:
  a cover enclosing the lower body and the lid assembly, wherein the cover includes a plurality of openings to facilitate airflow therethrough.

3. The part coating reactor of claim 2, further comprising:
  a fan disposed atop the cover to enhance air cooling of an exterior of the lower body and the lid assembly.

4. The part coating reactor of claim 1, wherein the interior volume has a volume of about 1 to about 1.5 liters.

5. The part coating reactor of claim 1, wherein a dimension across the interior volume is about 14 to about 20 inches.

6. The part coating reactor of claim 1, wherein each of the lower body and the lid assembly include a cavity formed in facing surfaces that together define the interior volume when the lower body and the lid assembly are assembled together.

7. The part coating reactor of claim 6, wherein the lower body includes a bottom plate and a sidewall extending upwardly from the bottom plate and partially enclosing the interior volume, and wherein the lid assembly includes a top plate and a sidewall extending downwardly from the top plate and partially enclosing the interior volume.

8. The part coating reactor of claim 7, further comprising one or more alignment features to facilitate alignment and interconnection of the lid assembly and the lower body, wherein the one or more alignment features include a protrusion or lip disposed around a peripheral edge of one of the lid assembly or the lower body and a mating recess provided in the other of the lid assembly or the lower body to receive and interface with the lip.

9. The part coating reactor of claim 1, further comprising:
  a seal disposed at an interface between the lid assembly and the lower body.

10. The part coating reactor of claim 9, wherein the seal includes a groove disposed in one of the lid assembly or the lower body to receive a gasket to facilitate maintaining a seal between the lid assembly and the lower body when assembled.

11. The part coating reactor of claim 1, wherein the one or more heaters is two annular heaters.

12. The part coating reactor of claim 1, wherein the one or more heaters comprises a plurality of ring-shaped heaters disposed in annular channels in an upper surface of the lid assembly.

13. The part coating reactor of claim 12, further comprising:
  an annular cap disposed over each of the one or more heaters to retain the heaters within the respective annular channels.

14. The part coating reactor of claim 13, wherein the one or more coolant channels comprises a first coolant channel formed in a top of the lid assembly between ones of the plurality of ring-shaped heaters, wherein the annular cap is disposed over the first coolant channel.

15. The part coating reactor of claim 1, further comprising:
  a thermostat disposed in or coupled to the lid assembly to monitor a temperature of the lid assembly during use.

16. The part coating reactor of claim 15, wherein the thermostat is coupled to a controller configured for feedback control of the temperature of the lid assembly during use.

17. The part coating reactor of claim 1, wherein the one or more coolant channels is a singular annular channel having an inlet and an outlet to facilitate coupling to a coolant source to circulate a coolant through the singular annular channel during use.

18. The part coating reactor of claim 1, further comprising:
one or more coolant channels disposed in the lower body to flow a heat transfer medium therethrough.

19. The part coating reactor of claim 1, wherein the plurality of fluidly independent plenums are configured to provide the one or more gases to particular zones of a plurality of zones of the interior volume.

20. The part coating reactor of claim 1, further comprising:
a plurality of conduits coupled to the plurality of gas passages to provide one or more process gases to the interior volume during operation.

21. The part coating reactor of claim 20, wherein the plurality of conduits comprise a first conduit, a second conduit, and a third conduit to supply three different gases to the interior volume.

22. The part coating reactor of claim 21, wherein each of the fluidly independent plenums are respectively coupled to different ones of the first conduit, the second conduit, or the third conduit.

23. The part coating reactor of claim 22, wherein each of the fluidly independent plenums are respectively coupled to different ones of the first conduit, the second conduit, or the third conduit at a plurality of locations.

24. The part coating reactor of claim 21, wherein each of the first conduit, the second conduit, and the third conduit are coupled to the respective plenums in an azimuthally symmetric manner.

25. The part coating reactor of claim 1, wherein the plurality of fluidly independent plenums include an outer annular plenum and one or more inner annular plenums.

26. The part coating reactor of claim 25, wherein the one or more inner annular plenums are two inner annular plenums.

27. The part coating reactor of claim 26, wherein the outer annular plenum is coupled to a first conduit to provide a first gas, and the two inner annular plenums are respectively coupled to different ones of a second conduit to provide a second gas and a third conduit to provide a third gas, wherein the first gas, the second gas, and the third gas are different from each other.

28. The part coating reactor of claim 26, wherein the outer annular plenum is coupled to a first conduit at a plurality of locations along the outer annular plenum, wherein a first inner annular plenum is coupled to a second conduit at a plurality of locations along the first inner annular plenum, and wherein a second inner annular plenum is coupled to a third conduit at a plurality of locations along the second inner annular plenum.

29. The part coating reactor of claim 28, wherein each of the pluralities of locations along any one annular plenum of the outer annular plenum and the two inner annular plenums are equidistantly spaced from each other.

30. The part coating reactor of claim 29, wherein the plurality of locations are six locations within each of the annular plenums.

31. The part coating reactor of claim 29, wherein none of the pluralities of locations are radially aligned with respect to each other.

32. The part coating reactor of claim 1, wherein each of the plurality of fluidly independent plenums comprises:

an annular channel disposed in a top surface of the lid assembly;
a cap disposed atop the annular channel, such that the annular channel and the cap define the fluidly independent plenum; and
one or more inlets disposed through the cap.

33. The part coating reactor of claim 1, further comprising:
a first conduit coupled to one of the fluidly independent plenums via a first plurality of legs;
a second conduit coupled to a different one of the fluidly independent plenums via a second plurality of legs different than the first plurality of legs; and
a third conduit coupled to a different one of the fluidly independent plenums via a third plurality of legs different than the first and second plurality of legs.

34. The part coating reactor of claim 33, wherein individual legs within a common one of the first, second, or third plurality of legs have horizontal portions disposed in a common plane and vertical portions extending from the common plane to the lid assembly, while legs within different ones of the first, second, or third plurality of legs have respective horizontal portions disposed in different planes.

35. The part coating reactor of claim 1, wherein at least one of a length, a residence time, or a conductance is substantially equal from a gas source to a respective plenum of the plurality of fluidly independent plenums.

36. The part coating reactor of claim 1, further comprising:
a remote plasma source (RPS) coupled to the interior volume through the lid assembly.

37. The part coating reactor of claim 36, further comprising:
a central opening disposed through the lid assembly, wherein the RPS is coupled to the interior volume via the central opening.

38. The part coating reactor of claim 37, further comprising:
a gas source coupled to the interior volume via the plurality of gas passages, wherein the gas source is configured to provide a plurality of different gases to the interior volume via different ones of the plurality of gas passages.

39. The part coating reactor of claim 38, further comprising:
a central opening disposed through the lid assembly, wherein the gas source is coupled to the interior volume via the central opening.

40. The part coating reactor of claim 38, wherein the plurality of fluidly independent plenums include an outer annular plenum, first inner annular plenum, and a second inner annular plenum, wherein the gas source is configured to provide an inert gas to the outer annular plenum, a first precursor to a first inner annular plenum, and a second precursor to a second inner annular plenum.

41. The part coating reactor of claim 1, wherein the one or more mounting brackets comprise a plurality of posts each having a through hole configured to be coupled to the lid assembly.

42. The part coating reactor of claim 1, further comprising:
a spacer to facilitate maintaining a gap between the workpiece and the lid assembly, wherein the spacer includes an outer edge disposed radially inward of the one or more mounting brackets and an outermost plenum of the plurality of fluidly independent plenums, and wherein the spacer includes an inner edge disposed radially outward of at least one plenum of the plurality of fluidly independent plenums.

43. The part coating reactor of claim 1, further comprising:
a liner configured to surround the workpiece and disposed along an outer periphery of the interior volume adjacent to the lid assembly.

44. The part coating reactor of claim 1, further comprising:
a pedestal heater disposed in the interior volume.

45. The part coating reactor of claim 44, wherein the pedestal heater has a diameter of about 500 to about 600 mm.

46. The part coating reactor of claim 44, further comprising:
an opening formed through the lower body to receive a shaft of the pedestal heater; and
a pedestal hub coupled to a bottom surface of a bottom plate of the lower body about the opening and extending downward from the bottom plate to surround and enclose the shaft of the pedestal heater.

47. The part coating reactor of claim 46, wherein a first gap of about 2 to about 4 mm is defined between an inner surface of a sidewall of the lower body and an outer peripheral edge of the pedestal heater, a second gap of about 3 to about 6 mm is defined between an upper surface of a bottom plate of the lower body and an opposing lower surface of the pedestal heater, and a third gap of about 3 to about 6 mm is defined between the opening of the lower body and the shaft.

48. The part coating reactor of claim 46, further comprising:
a choke cup disposed about the shaft and between the pedestal hub and the lower body, wherein the choke cup includes a plurality of openings between the shaft and the pedestal hub that provide flow conductance choke points to regulate the flow exiting the part coating reactor.

49. The part coating reactor of claim 48, wherein the choke cup comprises a tubular member including a flange that rests on a corresponding ledge formed along an inner diameter of the pedestal hub, wherein a fourth gap is defined between inner surfaces of the choke cup and an outer surface of the shaft, and a fifth gap is defined between an outer diameter of the choke cup and an inner diameter of the pedestal hub, wherein the plurality of openings fluidly couple the fourth gap to the fifth gap.

50. The part coating reactor of claim 48, wherein the choke cup has a length such that a bottom of the choke cup is spaced apart from a bottom inner surface of the pedestal hub to define a sixth gap therebetween.

51. The part coating reactor of claim 50, further comprising:
an annular groove formed in a bottom surface of an interior of the pedestal hub, the groove having a width that is greater than a wall thickness of the choke cup, wherein a bottom of the choke cup extends partially into the annular groove such that the sixth gap is defined between sidewalls and bottom of the annular groove and the portion of the bottom of the choke cup that extends partially into the annular groove.

52. The part coating reactor of claim 46, further comprising:
an opening formed in the pedestal hub to facilitate coupling the pedestal hub to an exhaust assembly of the part coating reactor.

53. The part coating reactor of claim 1, further comprising:
a central opening formed through the lower body to receive a shaft of a pedestal heater; and
a pedestal hub coupled to a bottom surface of a bottom plate of the lower body about the central opening and extending downward from the bottom plate to surround and enclose the shaft of the pedestal heater when installed.

54. The part coating reactor of claim 53, further comprising:
an exhaust assembly fluidly coupled to the interior volume through the pedestal hub.

55. The part coating reactor of claim 54, wherein the exhaust assembly comprises at least one of:
a throttle valve disposed in line along a conduit to couple the interior volume to a pump during operation;
a pressure gauge to monitor a pressure in the interior volume; or
an isolation valve and or a bypass valve to facilitate at least one of isolating or disconnecting the part coating reactor from the pump.

56. The part coating reactor of claim 1, further comprising:
a controller coupled to the part coating reactor to control operation of the part coating reactor.

57. The part coating reactor of claim 1, further comprising:
a plurality of thermal conduction chokes provided in the lid assembly to facilitate reduction of heat transfer away from an upper central portion of the lid assembly above the interior volume, wherein the plurality of thermal conduction chokes comprise recesses arranged along a circle proximate an outer peripheral edge of the lid assembly and radially outward of the interior volume, and wherein the recesses are elongate slots having major axes aligned or substantially aligned with the circle along which they are disposed.

58. The part coating reactor of claim 57, wherein the plurality of thermal conduction chokes further include a plurality of recesses formed in a side of the lid assembly and arranged along one or more circular rows along the outer peripheral edge of the lid assembly.

59. The part coating reactor of claim 1, further comprising:
a liner configured to surround the workpiece and disposed along an outer periphery of the interior volume adjacent to the lid assembly, wherein the liner has an annular body with an alternating plurality of flat surfaces and recessed portions along an inner wall of the annular body.

60. The part coating reactor of claim 59, further comprising:
a plurality of openings disposed through the annular body of the liner to facilitate coupling the liner to a bottom surface of the lid assembly.

61. The part coating reactor of claim 1, further comprising:
a spacer having a closed shape surrounding a central opening to facilitate maintaining a gap between the workpiece and the lid assembly, wherein an outer edge of the closed shape of the spacer is disposed radially inward of an outermost fluidly independent plenum of the plurality of fluidly independent plenums, and wherein an inner edge of the closed shape of the spacer is disposed radially outward of at least one plenum of the plurality of fluidly independent plenums.

62. A part coating reactor, comprising:
a lower body and a lid assembly that together define and enclose an interior volume;
one or more heaters disposed in the lid assembly;
one or more coolant channels disposed in the lid assembly to flow a heat transfer medium therethrough;
a plurality of gas passages disposed through the lid assembly to facilitate providing one or more gases to the interior volume, wherein the plurality of gas passages include a plurality of fluidly independent plenums disposed in the lid assembly;
a plurality of thermal conduction chokes provided in the lid assembly to facilitate reduction of heat transfer away from an upper central portion of the lid assembly above the interior volume, wherein the plurality of thermal conduction chokes comprise recesses arranged along a circle proximate an outer peripheral edge of the lid assembly and radially outward of the interior volume, and wherein the recesses are elongate slots having major axes aligned or substantially aligned with the circle along which they are disposed;
one or more mounting brackets to facilitate coupling a workpiece to the lid assembly;
a central opening formed through the lower body to receive a shaft of a pedestal heater; and
a pedestal hub coupled to a bottom surface of a bottom plate of the lower body about the central opening and extending downward from the bottom plate to surround and enclose the shaft of the pedestal heater when installed.

63. The part coating reactor of claim 62, further comprising:
a spacer having a closed shape surrounding a central opening to facilitate maintaining a gap between the workpiece and the lid assembly, wherein an outer edge of the closed shape of the spacer is disposed radially inward of an outermost fluidly independent plenum of the plurality of fluidly independent plenums, and wherein an inner edge of the closed shape of the spacer is disposed radially outward of at least one plenum of the plurality of fluidly independent plenums.

64. The part coating reactor of claim 62, further comprising:
a liner configured to surround the workpiece and disposed along an outer periphery of the interior volume adjacent to the lid assembly, wherein the liner has an annular body with an alternating plurality of flat surfaces and recessed portions along an inner wall of the annular body.

65. The part coating reactor of claim 64, further comprising:
a plurality of openings disposed through the annular body of the liner to facilitate coupling the liner to a bottom surface of the lid assembly.

66. The part coating reactor of claim 62, further comprising:
a choke cup disposed about the shaft and beneath a bottom surface of the lower body between the pedestal hub and the lower body, wherein the choke cup includes a plurality of openings that provide flow conductance choke points to regulate the flow exiting the part coating reactor.

67. The part coating reactor of claim 62, wherein the plurality of thermal conduction chokes further include a plurality of recesses formed in a side of the lid assembly and arranged along one or more circular rows along the outer peripheral edge of the lid assembly.

* * * * *